(12) United States Patent
Klayman et al.

(10) Patent No.: US 6,718,039 B1
(45) Date of Patent: Apr. 6, 2004

(54) ACOUSTIC CORRECTION APPARATUS

(75) Inventors: Arnold I. Klayman, Huntington Beach, CA (US); Alan D. Kraemer, Tustin, CA (US)

(73) Assignee: SRS Labs, Inc., Santa Ana, CA (US)

( * ) Notice: Subject to any disclaimer, the term of this patent is extended or adjusted under 35 U.S.C. 154(b) by 0 days.

(21) Appl. No.: 09/169,352

(22) Filed: Oct. 9, 1998

Related U.S. Application Data

(63) Continuation of application No. 08/508,593, filed on Jul. 28, 1995, now Pat. No. 5,850,453.

(51) Int. Cl.⁷ .............................. H04R 5/00; H03G 5/00
(52) U.S. Cl. ................................................. 381/1; 381/98
(58) Field of Search ................... 381/1, 17–18, 381/86, 302–303, 307, 98, 99

(56) References Cited

U.S. PATENT DOCUMENTS

| | | | |
|---|---|---|---|
| 3,229,038 A | 1/1966 | Richter | |
| 3,665,105 A | 5/1972 | Chowning | |
| 3,697,692 A | 10/1972 | Hafler | |
| 3,745,254 A | 7/1973 | Ohta et al. | |
| 3,757,047 A | 9/1973 | Ito et al. | |
| 3,761,631 A | 9/1973 | Ito et al. | |
| 3,772,479 A | 11/1973 | Hilbert | |
| 3,849,600 A | 11/1974 | Ohshima | |
| 3,885,101 A | 5/1975 | Ito et al. | |
| 3,921,104 A | 11/1975 | Gundry | 333/28 R |
| 3,925,615 A | 12/1975 | Nakano | |
| 4,024,344 A | 5/1977 | Dolby et al. | |
| 4,052,560 A | 10/1977 | Santmann | 381/98 |
| 4,204,092 A | 5/1980 | Bruney | |
| 4,209,665 A | 6/1980 | Iwihara | |
| 4,218,583 A | 8/1980 | Poulo | |
| 4,219,696 A | 8/1980 | Kogure | |
| 4,237,343 A | 12/1980 | Kurtin et al. | |
| 4,308,423 A | 12/1981 | Cohen | |
| 4,308,424 A | 12/1981 | Bice et al. | |

(List continued on next page.)

FOREIGN PATENT DOCUMENTS

| | | |
|---|---|---|
| DE | 3 331 352 A1 | 3/1985 |
| EP | 0 097 982 A3 | 1/1984 |
| EP | 0 312 406 A2 | 4/1989 |
| EP | 0 320 270 A2 | 6/1989 |
| EP | 0 354 517 A2 | 2/1990 |

(List continued on next page.)

OTHER PUBLICATIONS

Kaufman, "Frequency Contouring For Image Enhancement," *Audio*, 1985, pp. 34–39.

Eargle, J., "Multichannel Stereo Matrix Systems: An Overview", *Journal of the Audio Engineering Society*, pp. 552–558 (no date listed).

(List continued on next page.)

*Primary Examiner*—Xu Mei
(74) *Attorney, Agent, or Firm*—Knobbe Martens Olson & Bear LLP

(57) ABSTRACT

An acoustic correction apparatus processes a pair of left and right input signals to compensate for spatial distortion as a function of frequency when the input signals are reproduced through speakers in a sound system. The sound-energy of the left and right input signals is separated and corrected in a first low-frequency range and a second high-frequency range. The resultant signals are recombined to create image-corrected audio signals having a desired sound-pressure response when reproduced by the speakers in the sound system. The desired sound-pressure response creates an apparent sound image location with respect to a listener. The image-corrected signals may then be spatially-enhanced to broaden the apparent sound image.

55 Claims, 15 Drawing Sheets

U.S. PATENT DOCUMENTS

| | | |
|---|---|---|
| 4,309,570 A | 1/1982 | Carver |
| 4,329,544 A | 5/1982 | Yamada |
| 4,332,979 A | 6/1982 | Fischer |
| 4,355,203 A | 10/1982 | Cohen |
| 4,356,349 A | 10/1982 | Robinson |
| 4,393,270 A | 7/1983 | vandenBerg |
| 4,394,536 A | 7/1983 | Shima et al. |
| 4,408,095 A | 10/1983 | Ariga |
| 4,479,235 A | 10/1984 | Griffis |
| 4,489,432 A | 12/1984 | Polk |
| 4,495,637 A | 1/1985 | Bruney |
| 4,497,064 A | 1/1985 | Polk |
| 4,503,554 A | 3/1985 | Davis |
| 4,567,607 A | 1/1986 | Bruney |
| 4,569,074 A | 2/1986 | Polk |
| 4,589,129 A | 5/1986 | Blackmer |
| 4,594,610 A | 6/1986 | Patel |
| 4,594,729 A | 6/1986 | Weingartner |
| 4,594,730 A | 6/1986 | Rosen |
| 4,622,691 A | 11/1986 | Tokumo et al. |
| 4,648,117 A | 3/1987 | Kunugi et al. |
| 4,696,036 A | 9/1987 | Julstrom |
| 4,703,502 A | 10/1987 | Kasai |
| 4,748,669 A | 5/1988 | Klayman |
| 4,856,064 A | 8/1989 | Iwamatsu |
| 4,866,774 A | 9/1989 | Klayman |
| 4,866,776 A | 9/1989 | Kasai et al. |
| 4,888,809 A | 12/1989 | Knibbeler |
| 4,891,560 A | 1/1990 | Okumura et al. ....... 315/111.41 |
| 4,953,213 A | 8/1990 | Tasaki |
| 5,033,092 A | 7/1991 | Sadaie |
| 5,046,097 A | 9/1991 | Lowe |
| 5,105,462 A | 4/1992 | Lowe |
| 5,146,507 A | 9/1992 | Satoh et al. |
| 5,180,990 A | 1/1993 | Ohkuma |
| 5,208,860 A | 5/1993 | Lowe et al. |
| 5,228,085 A | 7/1993 | Aylward |
| 5,251,260 A | 10/1993 | Gates |
| 5,255,326 A | 10/1993 | Stevenson |
| 5,325,435 A | 6/1994 | Date et al. |
| 5,371,799 A | 12/1994 | Lowe et al. |
| 5,386,082 A | 1/1995 | Higashi |
| 5,420,929 A | 5/1995 | Geddes et al. |
| 5,533,129 A | 7/1996 | Gefvert |
| 5,661,808 A | 8/1997 | Klayman |
| 5,822,438 A | * 10/1998 | Sekine et al. ................. 381/17 |

FOREIGN PATENT DOCUMENTS

| | | |
|---|---|---|
| EP | 0 357 402 A2 | 3/1990 |
| EP | 0 526 880 A2 | 2/1993 |
| EP | 0 637 191 A2 | 2/1995 |
| EP | 0 699 012 A2 | 2/1996 |
| FI | 35 014 | 2/1966 |
| GB | 2 154 835 A | 9/1985 |
| GB | 2 277 855 A | 11/1994 |
| JP | 59-27692 | 2/1984 |
| JP | 61-33600 | 2/1986 |
| WO | WO 87/06090 | 10/1987 |
| WO | WO 91/19407 | 12/1991 |
| WO | WO 93/02503 | 2/1993 |

OTHER PUBLICATIONS

Stevens, S., et al., "Chapter 5: The Two–Eared Man", *Sound And Hearing*, pp. 98–106 and 196, 1965.

Vaughan D., "How We Hear Direction", *Audio*, pp. 51–55, Dec. 1983.

Allison, R., "The Loudspeaker / Living Room System", *Audio*, pp. 18–22, Nov. 1971.

Sundberg, J., "The Acoustics of the Singing Voice", *The Physics of Music*, pp. 16–23, 1978.

Schroeder, M. R., "An Artificial Stereophonic Effect Obtained from a Single Audio Signal", *Journal of the Audio Engineering Society*, vol. 6, No. 2, pp. 74–79, Apr. 1958.

Kurozomi, K., et al., "A New Sound Image Broadening Control System Using a Correlation Coefficient Variation Method", *Electronics and Communications in Japan*, vol. 67–A, No. 3, pp. 204–211, Mar. 1984.

Ishihara, M., "A New Analog Signal Processor For A Stereo Enhancement System", *IEEE Transactions on Consumer Electronics*, vol. 37, No. 4, pp 806–813, Nov. 1991.

* cited by examiner

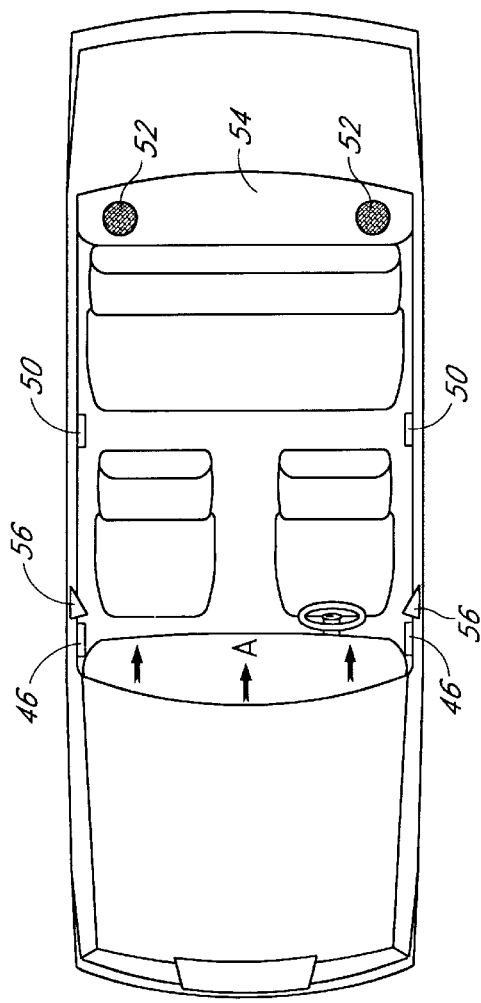
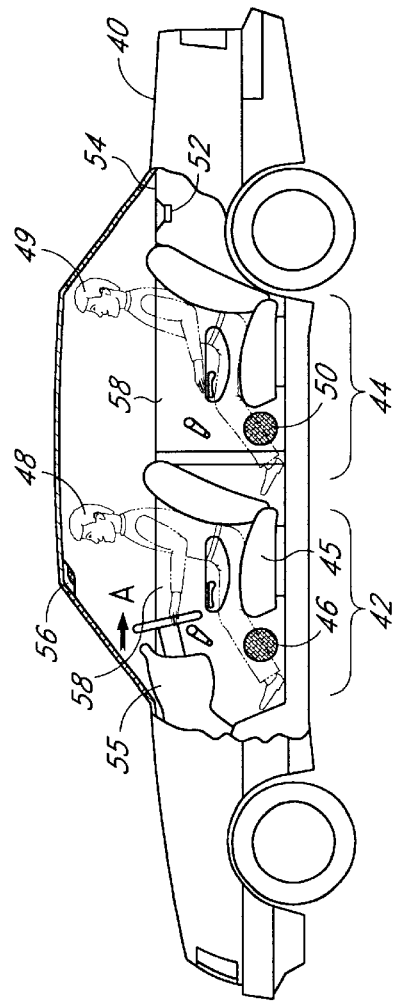

ACOUSTIC CORRECTION APPARATUS

This application is a continuation of U.S. patent application Ser. No. 08/508,593, filed on Jul. 28, 1995, now U.S. Pat. No. 5,850,453.

FIELD OF THE INVENTION

This invention relates generally to audio enhancement systems, and especially those systems and methods designed to improve the realism of stereo sound reproduction. More particularly, this invention relates to apparatus for overcoming the acoustic deficiencies of a sound system as perceived by a listener which can result when speakers within the sound system are not ideally positioned.

BACKGROUND OF THE INVENTION

In a sound reproduction environment various factors may serve to degrade the quality of reproduced sound as perceived by a listener. Such factors distinguish the sound reproduction from that of an original sound stage. One such factor is the location of speakers in a sound stage which, if inappropriately placed, may lead to a distorted sound-pressure response over the audible frequency spectrum. The placement of speakers also affects the perceived width of a soundstage. For example, speakers act as point sources of sound limiting their ability to reproduce reverberant sounds that are easily perceived in a live sound stage. In fact, the perceived sound stage width of many audio reproduction systems is limited to the distance separating a pair of speakers when placed in front of a listener. Another factor degrading the quality of reproduced sound may result from microphones which record sound differently from the way the human hearing system perceives sound. In an attempt to overcome the factors which degrade the quality of reproduced sound, countless efforts have been expended to alter the characteristics of a sound reproduction environment to mimic that heard by a listener in a live sound stage.

Some efforts at stereo image enhancement have focused on the acoustic abilities and limitations of the human ear. The human ear's auditory response is sensitive to sound intensity, phase differences between certain sounds, the frequency of the sound itself, and the direction from which sound emanates. Despite the complexity of the human auditory system, the frequency response of the human ear is relatively constant from person to person.

When sound waves having a constant sound pressure level across all frequencies are directed at a listener from a single location, the human ear will react differently to the individual frequency components of the sound. For example, when sound of equal sound pressure is directed towards a listener from in front of the listener, the pressure level created within the listener's ear by a sound of 1000 hertz will be different from that of 2000 hertz.

In addition to frequency sensitivity, the human auditory system reacts differently to sounds impinging upon the ear from various angles. Specifically, the sound pressure level within the human ear will vary with the direction of sound. The shape of the outer ear, or pinna, and the inner ear canal are largely responsible for the frequency contouring of sounds as a function of direction.

The human auditory response is sensitive to both azimuth and elevation changes of a sound's origin. This is particularly true for complex sound signals, i.e., those having multiple frequency components, and for higher frequency components in general. The variance in sound pressure within the ear is interpreted by the brain to provide indications of a sound's origin. When a recorded sound is reproduced, the directional cues to the sound's origin, as interpreted by the ear from sound pressure information, will thus be dependent upon the actual location of speakers that reproduce the sound.

A constant sound pressure level, i.e., a "flat" sound pressure versus frequency response, can be obtained at the ears of a listener from loudspeakers positioned directly in front of the listener. Such a response is often desirable to achieve a realistic sound image. However, the quality of a set of speakers may be less than ideal, and they may not be placed in the most acoustically-desirable location. Both such factors often lead to disrupted sound pressure characteristics. Sound systems of the prior art have disclosed methods to "correct" the sound-pressure emanating from speakers to create a spatially correct response thereby improving the resulting sound image.

To achieve a more spatially correct response for a given sound system, it is known to select and apply head-related-transfer-functions (HRTFs) to an audio signal. HRTFs are based on the acoustics of the human hearing system. Application of an HRTF is used to adjust the amplitudes of portions of the audio signal to compensate for spatial distortion. HRTF-based principles may also be used to relocate a stereo image from non-optimally placed loudspeakers.

The efforts made in the prior art to correct acoustic deficiencies within an audio reproduction system have often focused on the deficiencies present in automobile sound systems. One such attempt is disclosed in both U.S. Pat. No. 4,648,117 issued to Kunugi, et al., and U.S. Pat. No. 4,622,691 issued to Tokumo, et al. In the disclosures of Kunugi and Tokumo, a system for correcting sound absorption levels and for avoiding sound wave interference is described for use within a vehicle. The disclosed system includes a sound-pressure correcting circuit and a signal-delay circuit for achieving the desired frequency response. The sound-pressure correction is achieved by a high-frequency boost of the sound signal applied in three stages. The first stage is a high-frequency correction for the average sound absorption factor of a vehicle, the second high-frequency correction stage is dependent upon the sound absorption factor of a specific vehicle, and the third high-frequency correction factor is dependent upon the number of passengers seated within the vehicle.

In U.S. Pat. No. 5,146,507 issued to Satoh et al., an audio reproduction system control device is disclosed for correcting the frequency response of a given reproduction environment to match that of a standard frequency response characteristic. The system in Satoh provides a correction parameter for sound signals directed to front left, front right, rear left and rear right speakers of a sound field, such as in an automobile. Prestored acoustic characteristics relating to frequency and reflection are utilized to adapt the audio reproduction control device to a variety of sound environments.

Another system designed to modify a frequency response characteristic within an automobile is disclosed in U.S. Pat. No. 4,888,809 issued to Knibbeler. The system of Knibbeler attempts to create a flat frequency response at two separate non-coincident listening positions, such as the front and rear positions in an automobile passenger compartment, by adjusting a pair of filter units. Each of the filter units receives an input signal and affects an output signal delivered to a corresponding sound transducer.

Still other patents disclose sound systems which alter an audio signal to equalize the frequency response. Such patents include U.S. Pat. No. 5,371,799 issued to Lowe, et al., U.S. Pat. No. 5,325,435 issued to Date, et al., U.S. Pat. No. 5,228,085 issued to Aylward, U.S. Pat. No. 5,033,092 issued to Sadaie, U.S. Pat. No. 4,393,270 issued to van den Berg, and U.S. Pat. No. 4,329,544 issued to Yamada.

SUMMARY OF THE INVENTION

Despite the contributions from the prior art, there exists a need for an image correction apparatus which can easily be adapted to a variety of sound reproduction environments which have distorted spatial characteristics. There is also a need for such an image correction system which operates in conjunction with an image enhancement apparatus to spatially enhance the corrected stereo image.

The acoustic correction apparatus as disclosed herein, and the associated methods of operation, provide a sophisticated and effective system for improving a sound image in an imperfect reproduction environment.

To achieve an improved stereo image, an image correction device divides an input signal into first and second frequency ranges which collectively contain substantially all of the audio frequency spectrum. The frequency response characteristics of the input signal within the first and second frequency ranges are separately corrected and combined to create an output signal having a relatively flat frequency-response characteristic with respect to a listener. The level of frequency correction, i.e., sound-energy correction, is dependent upon the reproduction environment and tailored to overcome the acoustic limitations of such an environment. The design of the acoustic correction apparatus allows for easy and independent correction of the input signal within individual frequency ranges to achieve a spatially-corrected and relocated sound image.

Within an audio reproduction environment, speakers may be placed at a location remote from a listener's ears thereby adversely affecting a sound image perceived by the listener. For example, within an automobile, speakers for producing low, mid, and high range audio signals may be positioned in door panels below the listener's ears. The acoustic correction apparatus of the present invention relocates the sound image to an apparent position near the listener's ear level.

In some audio reproduction environments, the high-frequency transducers, or tweeters, are placed at locations remote from mid-range or low-frequency transducers, i.e., mid-range or woofer speakers. In an automobile, mid-range speakers are often placed in door panels or similar locations located near the legs or feet of a listener. Tweeters, however, may be positioned at a height near or above the listener's ear level to avoid interference or absorption by surrounding objects. The small size of tweeters allows for such remote placement within a vehicle. When tweeters are placed near a listener's ear, the sound pressure level at the listener's ears among the high-frequency ranges may be greater than the corresponding low-frequency ranges. Accordingly, the acoustic correction apparatus is designed so that correction of the higher frequency components may be either positive or negative. That is, the higher frequency components may be either boosted or attenuated, relative to a lower frequency component, to compensate for remote placement of the tweeters.

Through application of the acoustic correction apparatus, a stereo image generated from playback of an audio signal may be spatially corrected to convey a perceived source of origin having a vertical and/or horizontal position distinct from the position of the speakers. The exact source of origin perceived by a listener will depend on the level of spatial correction. In the context of an automobile, the acoustic correction apparatus disclosed herein may be used, in connection with door-mounted speakers, to achieve a substantially flat frequency response at an occupant's ear. Such a response will create an apparent stereo image positioned in front of the listener at approximate ear level.

Once a perceived sound origin is obtained through correction of spatial distortion, the corrected audio signal may be enhanced to provide an expanded stereo image. In accordance with a preferred embodiment, stereo image enhancement of a relocated audio image takes into account acoustic principles of human hearing to envelop the listener in a realistic sound stage. In those sound reproduction environments where a listening position is relatively fixed, such as the interior of an automobile, the amount of stereo image enhancement applied to the audio signal is partially determined by the actual position of the speakers with respect to the listener.

BRIEF DESCRIPTION OF THE DRAWINGS

The above and other aspects, features, and advantages of the present invention will be more apparent from the following particular description thereof presented in conjunction with the following drawings, wherein:

FIG. 2 is a diagram of a vehicle, as viewed from the side, showing the placement of speakers within the interior portion of the vehicle.

FIG. 3 is a diagram of the vehicle in FIG. 2, as viewed from the top, showing the placement of speakers within the interior portion of the vehicle.

DETAILED DESCRIPTION OF THE PREFERRED EMBODIMENT

Figure 1:
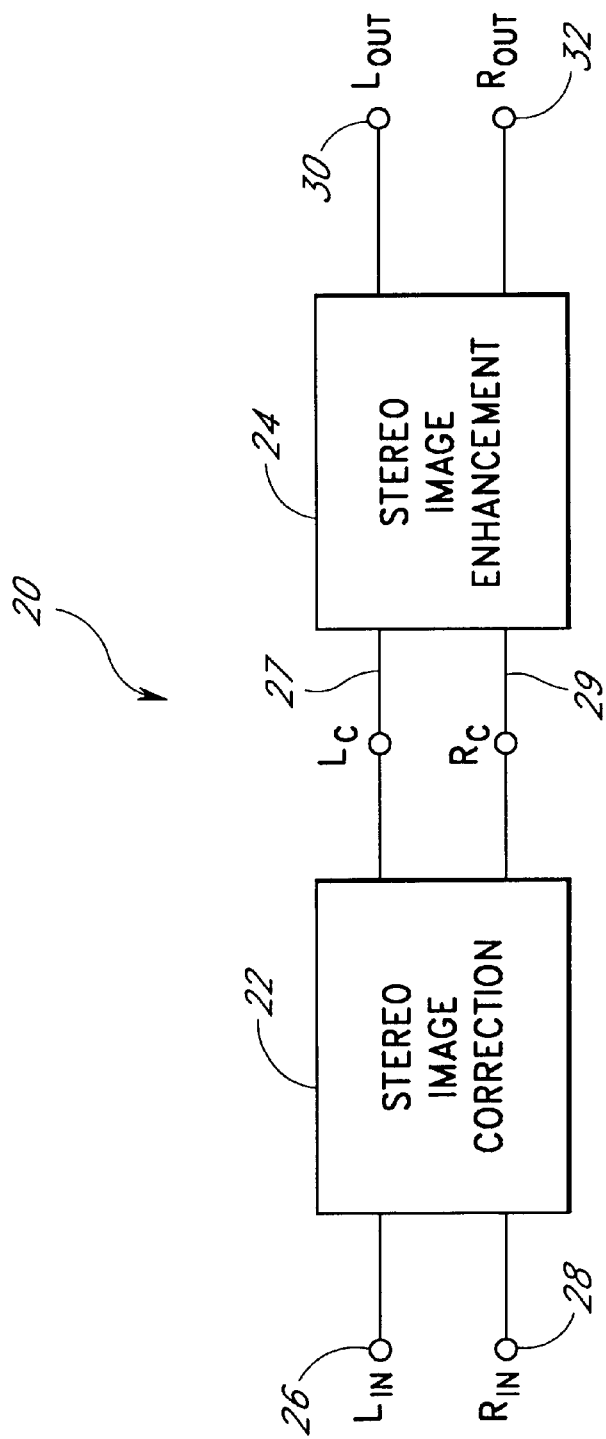
FIG. 1 is a schematic block diagram of a stereo image correction circuit operatively connected to a stereo enhancement circuit for creating a realistic stereo image from a pair of input stereo signals.

Referring initially to FIG. 1, a block diagram showing a preferred embodiment of the present invention is shown. Specifically, an acoustic correction apparatus 20 comprises an stereo image correction circuit 22 coupled to a stereo image enhancement circuit 24. The image correction circuit 22 inputs a left stereo signal 26 and a right stereo signal 28. An image-corrected left stereo signal, $L_c$, and right stereo signal, $R_c$, are transmitted to the stereo image enhancement device 24 along paths 27 and 29, respectively. The stereo image enhancement circuit 24 processes the signals, $L_c$ and $R_c$, and provides a left output signal 30 and a right output signal 32. The output signals 30 and 32 may in turn be connected to some other form of signal conditioning circuit, or they may be connected directly to speakers (not shown).

In a preferred embodiment of the present invention, the stereo image correction circuit 22 and the stereo image enhancement circuit 24 will operate in conjunction to overcome acoustic deficiencies of a sound reproduction environment. Such sound reproduction environments may be as large as a theater complex or as small as a portable electronic keyboard. One such environment where the advantages of the present invention are particularly effective is the interior of an automobile.

Referring now to FIG. 2, a vehicle 40 having an audio reproduction system is depicted to display, in a side-cutaway view, the interior seating arrangements and speaker placements of the vehicle 40. Similarly, in FIG. 3, the same speaker placements for the audio reproduction system are shown from a top view. The interior of the vehicle 40 can be divided into a forward section 42 and a rear section 44. The sound system of the vehicle 40 includes a pair of door-mounted speakers 46 mounted near the legs or feet of a forward-section occupant 48. Similarly, the rear section 44 of the vehicle 40 also includes a pair of door-mounted speakers 50. The locations of the speaker pairs 46 and 50 within the door panels is a popular choice of automobile manufacturers. In some vehicles, however, the door-mounted speakers 46 and 50 may be replaced by or supplemented with speakers 52 mounted on the rear parcel tray 54.

In addition, some automobile stereo systems have separate speaker locations to reproduce mid-range or lower-frequency sounds at different locations than sounds of higher frequencies. The vehicle 40 of FIG. 2 demonstrates such a stereo system. Specifically, a pair of high-frequency speakers 56, i.e., tweeters, are mounted above the occupant 48. The mounting position of the speakers 56 is often intended to avoid distortion and interference of the high-frequency sounds which may occur from objects within the vehicle 40. The location of the speakers 56 is possible due to the small size of tweeters.

Apart from the speaker positions shown in FIG. 2, there are various other possible locations where speakers may be placed in an automobile by either a manufacturer or by an aftermarket specialist. For example, speakers may be placed within the dashboard 55 or in other areas of the door panels 58. Regardless of the type of automobile stereo system, or the placement of speakers therein, it is desirable to achieve a frontal stereo image from the stereo system with respect to a listener situated within the vehicle.

Figure 4A:
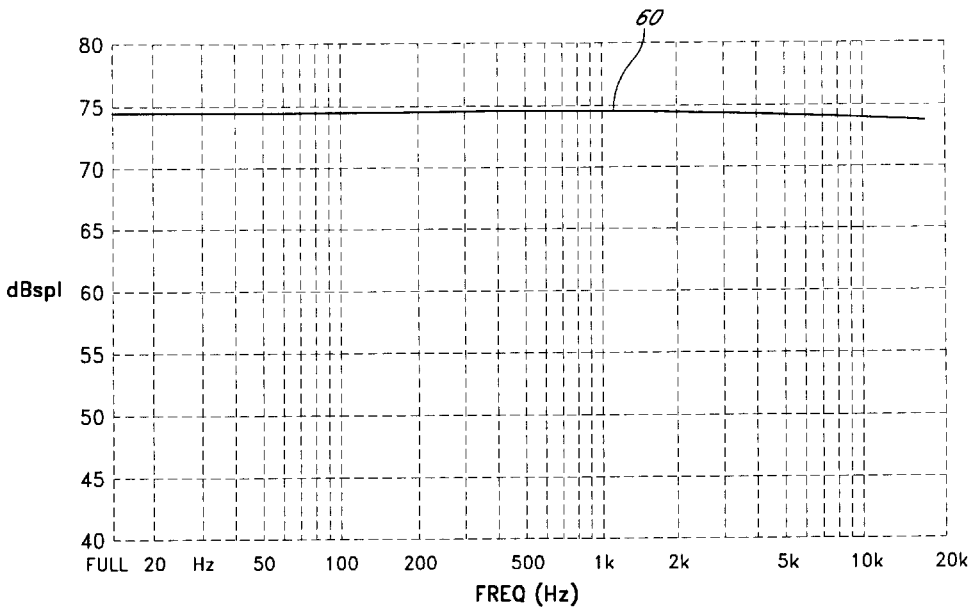
FIG. 4A is a graphical representation of a desired sound-pressure versus frequency characteristic for an audio reproduction system.

FIG. 4A depicts a graphical representation of a desired frequency response characteristic, appearing at the outer ears of a listener, within an audio reproduction environment. The curve 60 is a function of sound pressure level (SPL), measured in decibels, versus frequency. As can be seen in FIG. 4A, the sound pressure level is relatively constant for all audible frequencies. The curve 60 can be achieved from reproduction of pink noise through a pair of ideal speakers placed directly in front of a listener at approximately ear level. Pink noise refers to sound delivered over the audio frequency spectrum having equal energy per octave. In practice, the flat frequency response of the curve 60 may fluctuate in response to inherent acoustic limitations of speaker systems.

The curve 60 represents the sound pressure levels that exist before processing by the ear of a listener. Referring back to FIGS. 2 and 3, the flat frequency response represented by the curve 60 is consistent with sound emanating towards the occupant 48, from the location of the dashboard 55, in the direction A as shown. The human ear processes such sound, as represented by the curve 60, by applying its own auditory response to the sound signals. This human auditory response is dictated by the outer pinna and the interior canal portions of the ear.

Unfortunately, the frequency response characteristics of many automotive sound reproduction systems do not provide the desired characteristic shown in FIG. 4A. On the contrary, speakers may be placed in acoustically-undesirable locations to accommodate other ergonomic requirements. Referring again to FIG. 2, the door-mounted speakers 46 and 50 are positioned at a convenient and unobtrusive location. However, in such a position, sound emanating from the speakers 46 and 50 may be spectrally distorted by the mere placement of the speakers 46 and 50 with respect to the occupant 48. Moreover, the interior surroundings of the automobile 40, such as the legs of the occupant 48 and the automobile seats 45, may lead to absorption, or amplitude distortion, of the resulting sound signals. Such absorption, which is often prevalent among higher frequencies, has been the focus of some audio enhancements systems of the prior art.

Figure 4B:
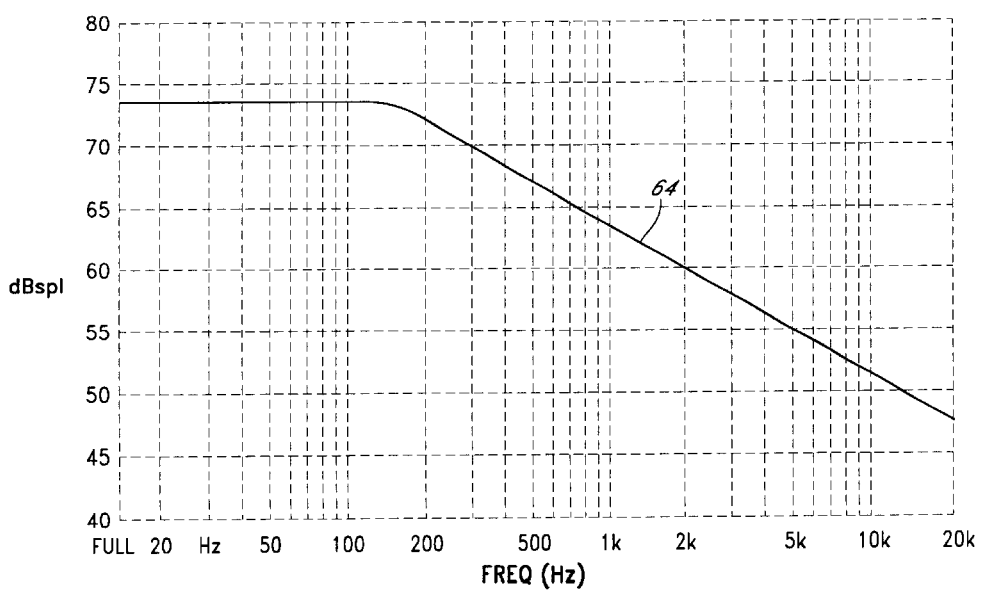
FIG. 4B is a graphical representation of a sound-pressure versus frequency characteristic corresponding to a first audio reproduction environment.
Figure 4C:
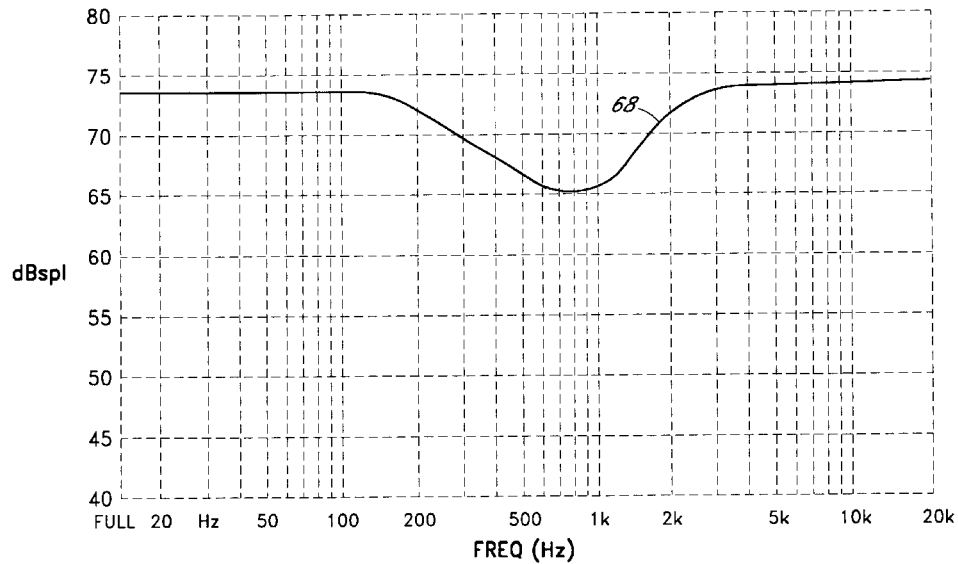
FIG. 4C is a graphical representation of a sound pressure versus frequency characteristic corresponding to a second audio reproduction environment.
Figure 4D:
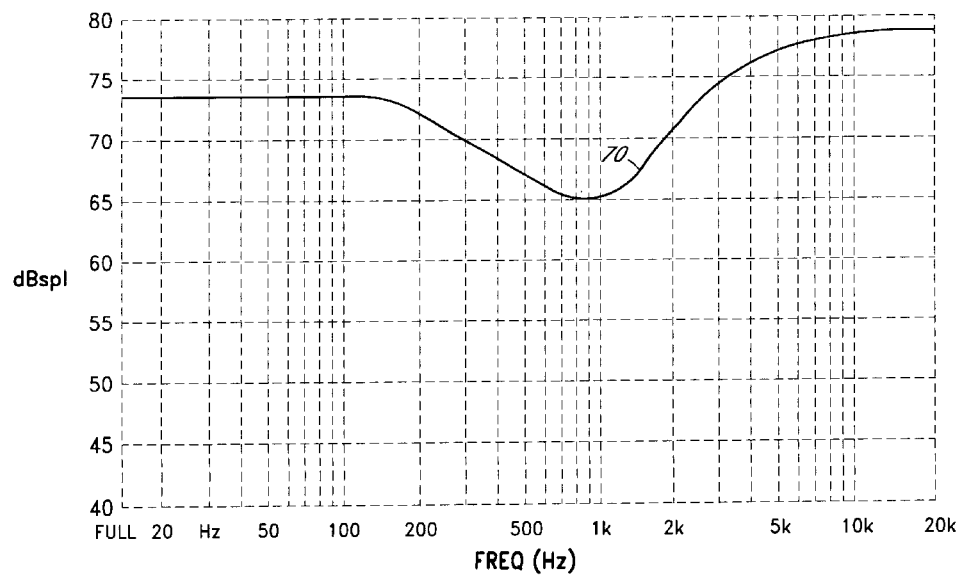
FIG. 4D is a graphical representation of a sound pressure versus frequency characteristic corresponding to a third audio reproduction environment.

As a result of both spectral and amplitude distortion, a stereo image perceived by the occupant 48 is spatially distorted providing an undesirable listening experience. FIGS. 4B–4D graphically depict levels of spatial distortion for various automotive sound reproduction systems. The distortion characteristics depicted in FIGS. 4B–4D represent sound pressure levels, measured in decibels, which are present near the ears of a listener.

The frequency response curve 64 of FIG. 4B has a decreasing sound-pressure level at frequencies above approximately 100 Hz. The curve 64 represents a possible sound pressure characteristic generated from speakers, containing both woofers and tweeters, which are mounted in an automobile below a listener. For example, assuming the speakers 46 of FIG. 2 contain tweeters, an audio signal played through only such speakers 46 might exhibit the response of FIG. 4B. Assuming the sound pressure response of FIG. 4B is obtained in the automobile of FIG. 2, the occupant 48 will localize a resulting sound image in the lower portion of the forward section 42.

The particular slope associated with the decreasing curve 46 will likely vary, and may not be entirely linear, depending on the automobile's interior, the quality of the speakers, and the exact positioning of the speakers within the door panels 58. For example, a leather or vinyl interior will be more reflective of audio signals, particularly at higher frequencies, than a cloth interior. The level of spectral distortion will vary significantly as speakers are placed further from, and positioned away from, a listener.

FIG. 4C is a graphical representation of a sound-pressure versus frequency characteristic 68 wherein a first frequency range of audio signals are spectrally distorted, but a higher frequency range of the signals are not distorted. The characteristic curve 68 may be achieved from a speaker arrangement having low to mid-frequency speakers placed below a listener and high-frequency speakers positioned near, or at a listener's ear level. Referring again to FIG. 2, such low to mid-frequency speakers would correspond to the speakers 46, while such high-frequency speakers (not shown) would be placed somewhere on the dashboard 55. With this arrangement, the frequency response curve 68 has a maximum amplitude level at approximately 100 Hz which decreases as a function of frequency up to approximately 1000 Hz. At 1000 Hz, the curve 68 again increases up to the maximum amplitude level. The increase in sound pressure level above 1000 Hz is a direct result of tweeters placed in an unobstructed position in front of the vehicle's occupant 48. The sound image resulting from the characteristic curve 68 will have a low-frequency component positioned below the occupant 48 of FIG. 2, and a high-frequency component positioned near the occupant's ear level.

FIG. 4D is a graphical representation of a sound-pressure versus frequency characteristic 70 having a reduced sound pressure level among lower frequencies and an increasing sound pressure level among higher frequencies. The characteristic 70 is achieved from a speaker arrangement having mid to low-frequency speakers placed below a listener and high-frequency speakers positioned above a listener. Such an arrangement corresponds to an audio system including the speakers 46 and 56 of FIG. 2. Having tweeters placed above the ear in the roof of a car provides an unobstructed and relatively short path directly to an occupant's ears. Hence, as the curve 70 of FIG. 4D indicates, the sound pressure level at frequencies above 1000 Hz may be significantly higher than lower frequencies, creating an undesirable audio effect for a nearby listener. The sound image resulting from the characteristic curve 70 will have a low-frequency component positioned below the occupant 48 of FIG. 2, and a high-frequency component positioned above the occupant 48.

The audio characteristics of FIGS. 4B–4D represent various sound pressure levels obtainable within the forward section 42 (shown in FIG. 2) and heard by the occupant 48. In an automotive reproduction environment having a forward and a rear section, it is possible to readjust a sound image within each section. Most automobiles are equipped with separate front and rear channels allowing for such separate signal correction. The signal conditioning required to correct for spatial distortion in the rear section 44 will depend on the particular speaker locations. For example, the speakers 50 of FIG. 2 would require substantially the same level of spatial correction as the pair of speakers 46. This is true because the speakers 46 and 50 are situated in identical positions with respect to a forward occupant 48 and a rear occupant, respectively. If however, the rear channel speakers consist of, or additionally include, the upward facing speakers 52, then a different level of conditioning will be applied, if any, to correct for spatial distortion in the rear listening compartment of the vehicle 40.

The audio response curves of FIGS. 4B–4D are but a few examples of how audio signals present at the ears of a listener are distorted by various audio reproduction systems. The exact level of spatial distortion at any given frequency will vary widely depending on the reproduction system and the reproduction environment. Through application of a preferred embodiment of the present invention as discussed herein, an apparent location can be generated for a speaker system defined by apparent elevation and azimuth coordinates, with respect to a fixed listener, which are different from those of actual speaker locations.

Figure 5:
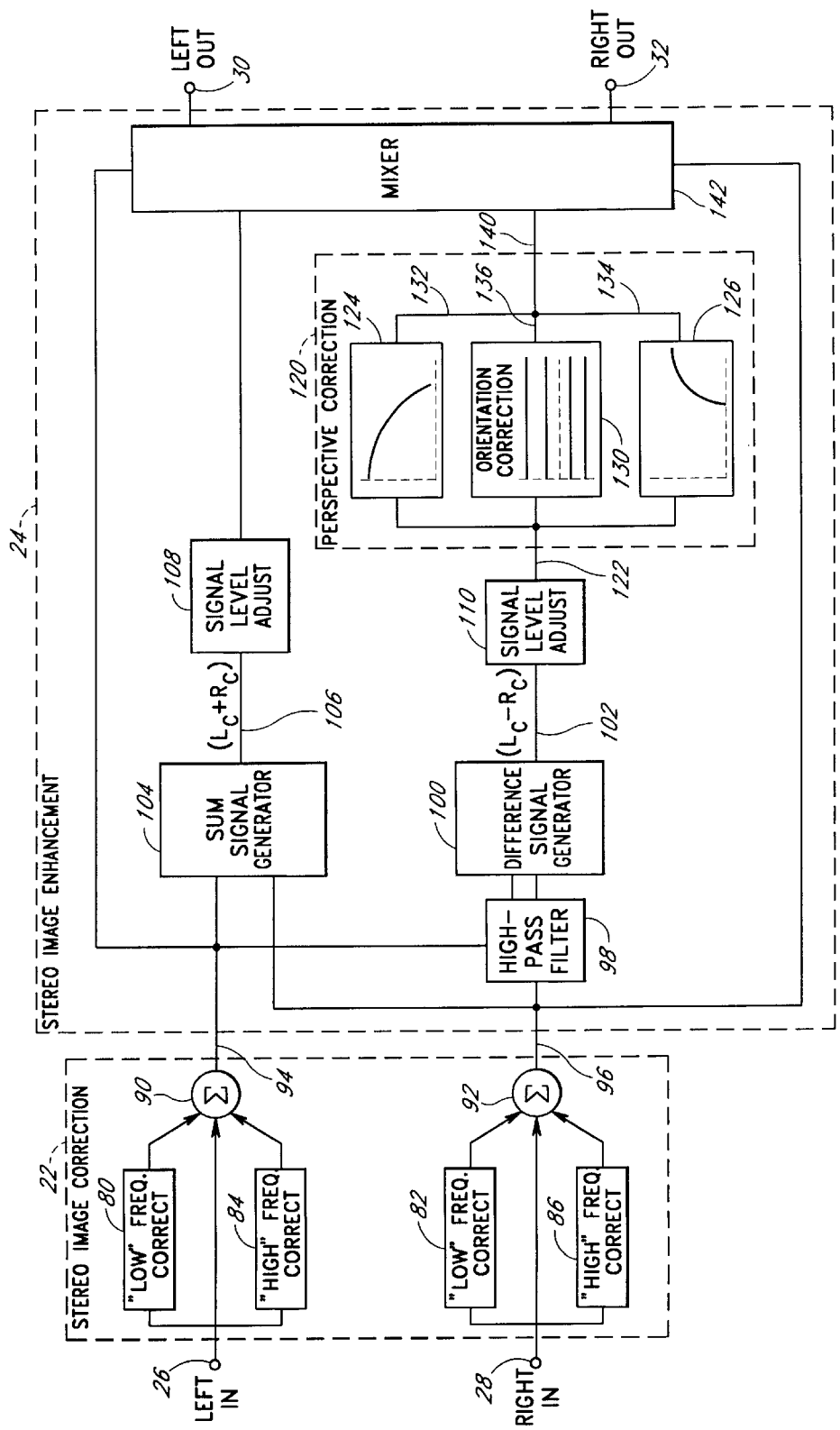
FIG. 5 is a schematic block diagram of an energy-correction circuit operatively connected to a stereo image enhancement circuit for creating a realistic stereo image from a pair of input stereo signals.

FIG. 5 discloses a detailed block diagram of a preferred embodiment of the present invention. A preferred embodiment comprises a stereo image correction circuit 22 which inputs the left and right stereo signals 26 and 28. The image-correction circuit 22 corrects the distorted spectral densities of various sound systems by advantageously dividing the audible frequency spectrum into a first frequency component, containing relatively lower frequencies, and a second frequency component, containing relatively higher frequencies. Each of the left and right signals 26 and 28 is separately processed through corresponding low-frequency correction circuits 80, 82, and high-frequency correction circuits 84 and 86. It should be pointed out that in a preferred embodiment the correction circuits 80 and 82 will operate in a relatively "low" frequency range of approximately 100 to 1000 hertz, while the correction circuits 84 and 86 will operate in a relatively "high" frequency range of approximately 1000 to 10,000 hertz. This is not to be confused with the general audio terminology wherein low frequencies represent frequencies up to 100 hertz, mid frequencies represent frequencies between 100 to 4 kHz, and high frequencies represent frequencies above 4 kHz.

By separating the lower and higher frequency components of the input audio signals, corrections in sound pressure level can be made in one frequency range independent of the other. The correction circuits 82, 84, 86, and 88 modify the input signals 26 and 28 to correct for spectral and amplitude distortion of the input signals upon reproduction by speakers. The resultant signals, along with the original input signals 26 and 28, are combined at respective summing junctions 90 and 92. The corrected left stereo signal, $L_c$, and the corrected right stereo signal, $R_c$, are provided along outputs 94 and 96, respectively.

The corrected stereo signals at outputs 94 and 96 have a flat, i.e., uniform, frequency response appearing at the ears of the occupant 48 (shown in FIG. 2). This spatially-corrected response creates an apparent source of sound which, when played through the speakers 46 of FIG. 2, is seemingly positioned directly in front of the occupant 48. Once the sound source is properly positioned through energy correction of the audio signal, the stereo enhancement circuit 24 conditions the stereo signals to broaden the stereo image emanating from the apparent sound source. As will be discussed in conjunction with FIGS. 8A and 8B, the stereo image enhancement circuit 24 may require adjustment through a stereo orientation device 130 to compensate for the actual location of the sound source.

In a preferred embodiment, the stereo enhancement system 24 equalizes the difference signal information present in the left and right stereo signals. The stereo enhancement system 24 disclosed herein is similar to that disclosed in the copending application Ser. No. 08/430,751. Related stereo enhancement systems for use in the present invention are also disclosed in U.S. Pat. Nos. 4,748,669 and 4,866,774 both issued to Arnold Klayman, one of the same inventors of the invention disclosed in the present application. The disclosures of U.S. Pat. No. 4,748,669, is U.S. Pat. No. 4,866,774, and application Ser. No. 08/430,751 are incorporated by reference as though fully set forth herein.

The signals, $L_c$ and $R_c$, transmitted along paths 94 and 96 are inputted by the enhancement system 24 and fed to a high-pass filter 98. The filter 98 may in actuality comprise two individual high-pass filters. The filter 98 is a pre-conditioning filter which is designed to reduce the bass components below approximately 100 hertz which may be undesirably present in the difference signal. The outputs from the filter 98 are transmitted to a difference-signal generator 100. A difference signal ($L_c-R_c$) representing the stereo content of the corrected left and right input signals, is presented at an output 102. The outputs from the stereo image correction circuit 22 are also transmitted directly to a sum signal generator 104. A sum signal, ($L_c-R_c$) representing the sum of the corrected left and right stereo signals is generated at an output 106.

The sum and difference signals at outputs 102 and 106 are fed to separate level-adjusting devices 108 and 110, respectively. The devices 108 and 110 are ideally potentiometers or similar variable-impedance devices. Adjustment of the devices 108 and 110 is typically performed manually to control the base level of sum and difference signal present in the output signals. This allows a user to tailor the level and aspect of stereo enhancement according to the type of sound reproduced, and depending on the user's personal preferences. An increase in the base level of the sum signal emphasizes the audio information at a center stage positioned between a pair of speakers. Conversely, an increase in the base level of difference signal emphasizes the ambient sound information creating the perception of a wider sound image. In some audio arrangements where the music type and system configuration parameters are known, or where manual adjustment is not practical, the adjustment devices 108 and 110 may be eliminated requiring the sum and difference-signal levels to be predetermined and fixed.

The output of the device 110 is fed into a stereo enhancement equalizer 120 at an input 122. The equalizer 120 spectrally shapes the difference signal appearing at the input 122 by separately applying a low-pass audio filter 124 and a high-pass audio filter 126 to the difference signal. In addition to the conditioning provided by filters 124 and 126, the difference-signal level is separately adjusted by a stereo orientation circuit 130. Output signals from the filters 124, 126, and the orientation circuit 130 exit the equalizer 120 along paths 132, 134, and 136, respectively.

The modified difference signals transferred along paths 132, 134, and 136 are the components of a processed difference signal, $(L_c-R_c)_p$, appearing along an output 140. The processed difference signal is fed into a mixer 142, which also receives the sum signal from the device 106, as well as the stereo signals $L_c$ and $R_c$ from outputs 94 and 96. All of these signals are combined within the mixer 142 to produce an enhanced and spatially-corrected left output signal 30 and right output signal 32.

The conditioning of the left and right output signals 30 and 32 provided by the enhancement circuit 24 is represented by the following mathematical formulas:

$$L_{out}=L_c+K_1(L_c+R_c)+K_2(L_c-R_c)_p \qquad (1)$$

$$R_{out}=R_c+K_1(L_c+R_c)-K_2(L_c-R_c)_p \qquad (2)$$

Although the input signals $L_c$ and $R_c$ in the equations above ideally represent corrected stereo source signals, they may also be synthetically generated from a monophonic source. One such method of stereo synthesis which may be used with the present invention is disclosed in U.S. Pat. No. 4,841,572, also issued to Arnold Klayman and incorporated herein by reference.

Image Correction Characteristics

Figure 6A:
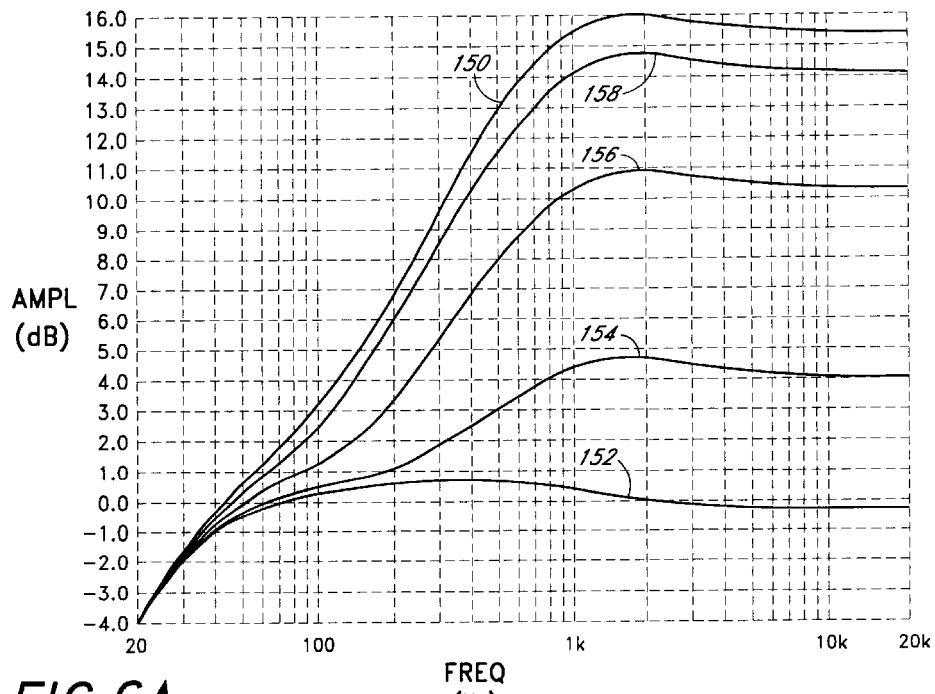
FIG. 6A is a graphical representation of the various levels of signal modification provided by a low-frequency correction circuit in accordance with a preferred embodiment.
Figure 6B:
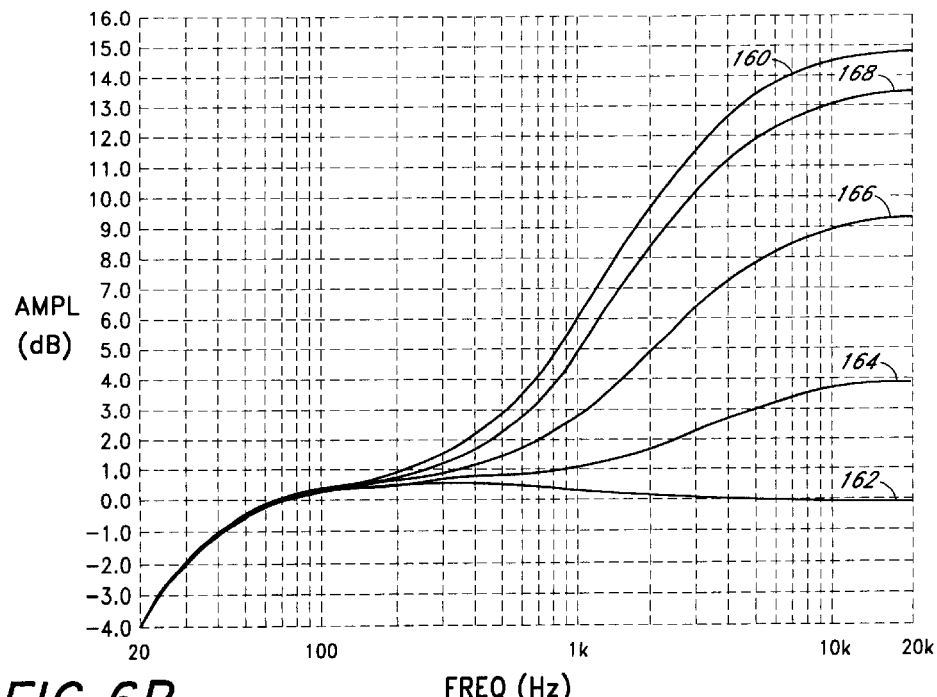
FIG. 6B is a graphical representation of the various levels of signal modification provided by a high-frequency correction circuit for boosting high-frequency components of an audio signal in accordance with a preferred embodiment.
Figure 6C:
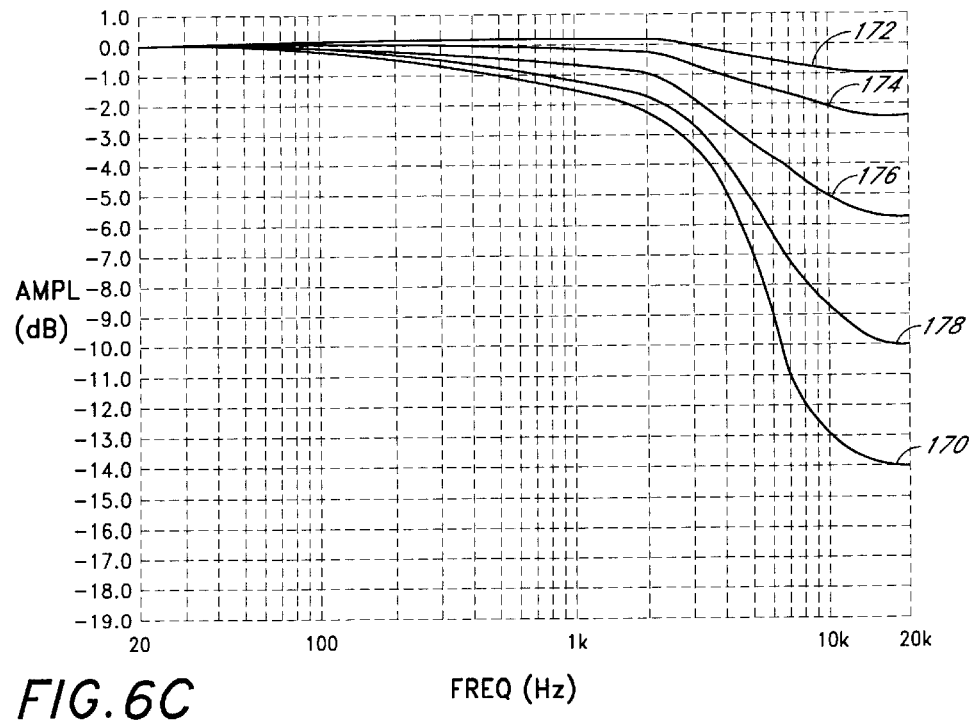
FIG. 6C is a graphical representation of the various levels of signal modification provided by a high-frequency correction circuit for attenuating high-frequency components of an audio signal in accordance with a preferred embodiment.

FIGS. 6A–6C are graphical representations of the levels of spatial correction provided by "low" and "high"-frequency correction circuits 80, 82, 84, 86 in order to obtain a relocated image generated from a pair of stereo signals.

Referring initially to FIG. 6A, possible levels of spatial correction provided by the correction circuits 80 and 82 are depicted as curves having different amplitude-versus-frequency characteristics. The maximum level of correction, or boost (measured in dB), provided by the circuits 80 and 82 is represented by a correction curve 150. The curve 150 provides an increasing level of boost within a first frequency range of approximately 100 Hz and 1000 Hz. At frequencies above 1000 Hz, the level of boost is maintained at a fairly constant level. A curve 152 represents a near-zero level of correction.

To those skilled in the art, a typical filter is usually characterized by a pass-band and stop-band of frequencies separated by a cutoff frequency. The correction curves, of FIGS. 6A–6C, although representative of typical signal filters, can be characterized by a pass-band, a stop-band, and a transition band. A filter constructed in accordance with the characteristics of FIG. 6A has a pass-band above approximately 1000 Hz, a transition-band between approximately 100 and 1000 Hz, and a stop-band below approximately 100 Hz. Filters according to FIGS. 6B and 6C have pass-bands above approximately 10 kHz, transition-bands between approximately 1 kHz and 10 kHz, and a stop-band below approximately 1 kHz. Because the filters used in accordance with a preferred embodiment are only first-order filters, the frequencies defining the pass, stop, and transition bands are only design goals. The exact characteristic frequencies may vary significantly for a given circuit.

As can be seen in FIGS. 6A–6C, spatial correction of an audio signal by the circuits 80, 82, 84, and 86 is substantially uniform within the pass-bands, but is largely frequency-dependent within the transition bands. The amount of acoustic correction applied to an audio signal can be varied as a function of frequency through adjustment of the stereo image correction circuit 22 which varies the slope of the transition bands of FIGS. 6A–6C. As a result, frequency-dependent correction is applied to a first frequency range between 100 and 1000 hertz, and applied to a second frequency range of 1000 to 10,000 hertz. An infinite number of correction curves are possible through independent adjustment of the correction circuits 80, 82, 84 and 86.

In accordance with a preferred embodiment, spatial correction of the higher frequency stereo-signal components occurs between approximately 1000 Hz and 10,000 Hz. Energy correction of these signal components may be positive, i.e., boosted, as depicted in FIG. 6B, or negative, i.e., attenuated, as depicted in FIG. 6C. The range of boost provided by the correction circuits 84, 86 is characterized by a maximum-boost curve 160 and a minimum-boost curve 162. Curves 164, 166, and 168 represent still other levels of boost which may be required to spatially correct sound emanating from different sound reproduction systems.

FIG. 6C depicts energy-correction curves that are essentially the inverse of those in FIG. 6B. As previously discussed, attenuation of higher frequency sound signals may be required in cases where tweeters are mounted above a listener and apart from the corresponding woofers or mid-range speakers. The levels of attenuation obtainable from the circuits 84 and 86 may vary from a maximum level of attenuation, represented by a curve 170, to a minimum level of attenuation, represented by a curve 172. Intermediate curves 174, 176, and 178 represent some of the possible variances therebetween.

Figure 6D:
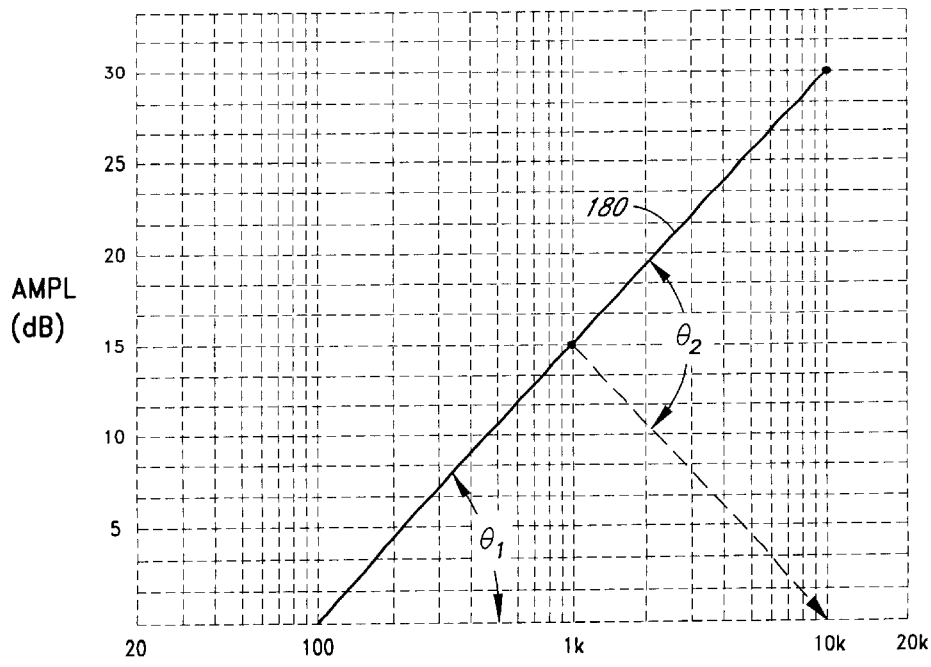
FIG. 6D is a graphical representation of a composite energy-correction curve depicting the possible ranges of sound-pressure correction for relocating a stereo image.

Since the lower frequency and higher frequency correction factors, represented by the curves of FIGS. 6A–6C, are added together, there is a wide range of possible spatial correction curves applicable between the frequencies of 100 to 10,000 Hz. FIG. 6D is a graphical representation depicting a range of composite spatial correction characteristics provided by the stereo image correction circuit 22. Specifically, the solid line curve 180 represents a maximum level of spatial correction comprised of the curve 150 (shown in FIG. 6A) and the curve 160 (shown in FIG. 6B). Correction of the lower frequencies may vary from the solid curve 180 through the range designated by $\theta_1$. Similarly, correction of the higher frequencies may vary from the solid curve 180 through the range designated by $\theta_2$. Accordingly, the amount of boost applied to the first frequency range of 100 to 1000 hertz varies between approximately 0 and 15 dB, while the correction applied to the second frequency range of 1000 to 10,000 hertz may vary from approximately 30 dB to −15 dB.

Image Enhancement Characteristics

Figure 7:
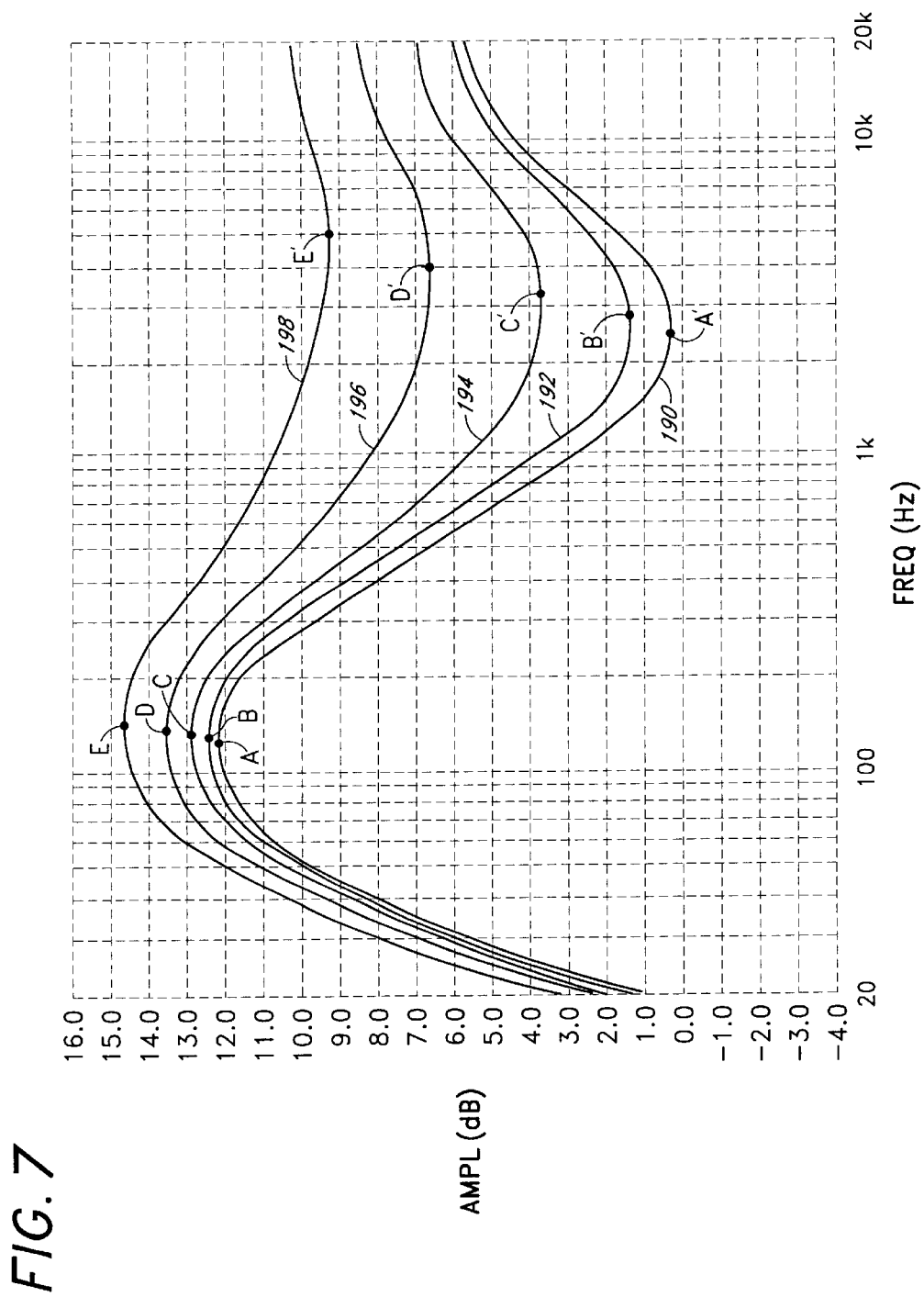
FIG. 7 is a graphical representation of various levels of equalization applied to an audio difference signal to achieve varying amounts of stereo image enhancement.

Turning now to the stereo image enhancement aspect of the present invention, a series of perspective-enhancement, or normalization curves, is graphically represented in FIG. 7. The signal $(L_c-R_c)_p$ in equations 1 and 2 above represents the processed difference signal which has been spectrally shaped according to the frequency-response characteristics of FIG. 7. These frequency-response characteristics are applied by the equalizer 120 depicted in FIG. 5 and are partially based upon HRTF principles.

In general, selective amplification of the difference signal enhances any ambient or reverberant sound effects which may be present in the difference signal but which are masked by more intense direct-field sounds. These ambient sounds are readily perceived in a live sound stage at the appropriate level. In a recorded performance, however, the ambient sounds are attenuated relative to a live performance. By boosting the level of difference signal derived from a pair of stereo left and right signals, a projected sound image can be broadened significantly when the image emanates from a pair of loudspeakers placed in front of a listener.

The perspective curves 190, 192, 194, 196, and 198 of FIG. 7 are displayed as a function of gain against audible frequencies displayed in log format. The different levels of equalization between the curves of FIG. 7 are required to account for various audio reproduction systems. Specifically, in a preferred embodiment, the level of difference-signal equalization is a function of the actual placement of speakers relative to a listener within an audio reproduction system. The curves 190, 192, 194, 196, and 198 generally display a frequency contouring characteristic similar to that described in detail in the copending application Ser. No. 08/430,751. That is, lower and higher difference-signal frequencies are boosted relative to a mid-band of frequencies.

According to a preferred embodiment, the range for the perspective curves of FIG. 7 is defined by a maximum gain of approximately 10–15 dB located at approximately 125 to 150 Hz. The maximum gain values denote a turning point for the curves of FIG. 7 whereby the slopes of the curves 190, 192, 194, 196, and 198 change from a positive value to a negative value. Such turning points are labelled as points A, B, C, D, and E in FIG. 7. The gain of the perspective curves decreases below 125 Hz at a rate of approximately 6 dB per octave. Above 125 Hz, the gain of the curves of FIG. 7 also decreases, but at variable rates, towards a minimum-gain turning point of approximately −2 to +10 dB. The minimum-gain turning points vary significantly between the curves 190, 192, 194, 196, and 198. The minimum-gain turning points are labelled as points A', B', C', D', and E', respectively. The frequencies at which the minimum-gain turning points occur varies from approximately 2.1 kHz for curve 190 to approximately 5 kHz for curve 198. The gain of the curves 190, 192, 194, 196, and 198 increases above their respective minimum-gain frequencies up to approximately 10 Khz. Above 10 Khz, the gain applied by the perspective curves begins to level off. An increase in gain will continue to be applied by all of the curves, however, up to approximately 20 Khz, i.e., approximately the highest frequency audible to the human ear.

The preceding gain and frequency figures are merely design objectives and the actual figures will likely vary from circuit to circuit depending on the actual value of components used. Moreover, adjustment of the signal level devices 108 and 110 will affect the maximum and minimum gain values, as well as the gain separation between the maximum-gain frequency and the minimum-gain frequency.

Equalization of the difference signal in accordance with the curves of FIG. 7 is intended to boost the difference signal components of statistically lower intensity without overemphasizing the higher-intensity difference signal components. The higher-intensity difference signal components of a typical stereo signal are found in a mid-range of frequencies between approximately 1 to 4 kHz. The human ear has a heightened sensitivity to these same mid-range of frequencies. Accordingly, the enhanced left and right output signals 30 and 32 produce a much improved audio effect because ambient sounds are selectively emphasized to fully encompass a listener within a reproduced sound stage.

Although the overall equalization applied by the perspective curves 190, 192, 194, 196, and 198 is accomplished using high-pass and low-pass filters of the equalizer 120, it is possible to also use a band-rejection filter to provide the same signal conditioning. Also, implementation of the perspective curve by a digital signal processor will, in most cases, more accurately reflect the design constraints discussed above. For an analog implementation, it is acceptable if the frequencies corresponding to the maximum and minimum gains vary by plus or minus 20 percent. Such a deviation from the ideal specifications will still produce the desired stereo enhancement effect, although with less than optimum results.

As can be seen in FIG. 7, difference signal frequencies below 125 Hz receive a decreased amount of boost, if any, through the application of the perspective curve 70. This decrease is intended to avoid over-amplification of very low, i.e., bass, frequencies. With many audio reproduction systems, amplifying an audio difference signal in this low-frequency range can create an unpleasurable and unrealistic sound image having too much bass response. Examples of such audio reproduction systems include near-field or low-power audio systems, such as multimedia computer systems, as well as home stereo systems. A large draw of power in these systems may cause amplifier "clipping" during periods of high boost, or it may damage components of the audio circuit including the speakers. Limiting the bass response of the difference signal also helps avoid these problems in most near-field audio enhancement applications. Further acoustic advantages of difference-signal equalization are detailed in the copending application Ser. No. 08/430,751.

Figure 8A:
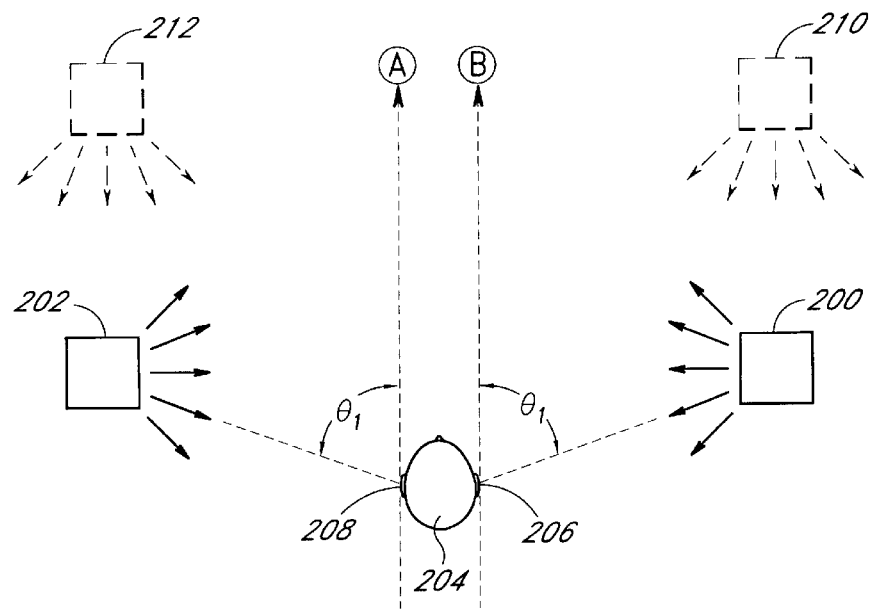
FIG. 8A is a diagram depicting the perceived and actual origins of sounds heard by a listener from speakers placed at a first location.
Figure 8B:
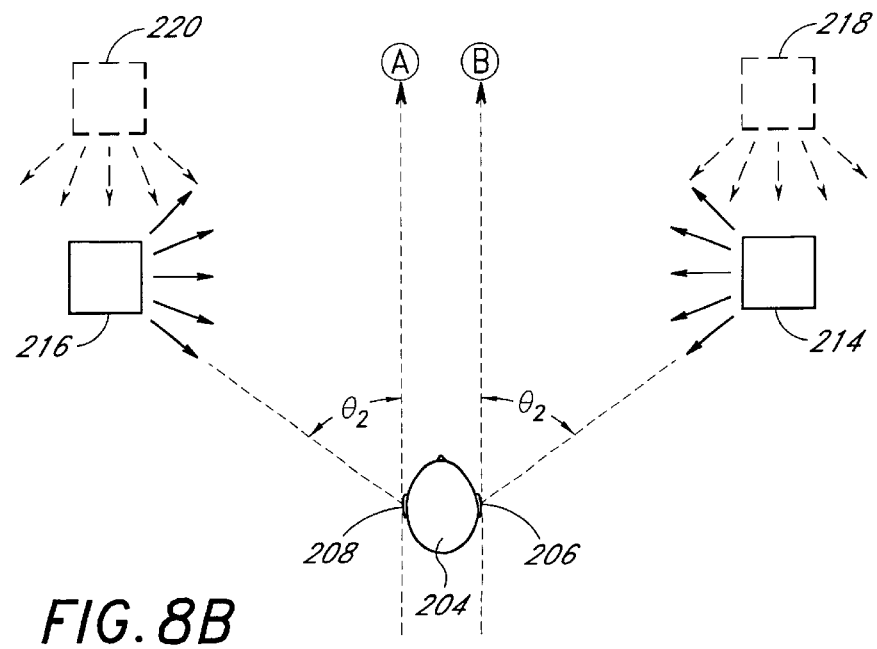
FIG. 8B is a diagram depicting the perceived and actual origins of sounds heard by a listener from speakers placed at a second location.

In accordance with a preferred embodiment, the level of difference signal equalization in an audio environment having a stationary listener is dependent upon the actual speaker types and their locations with respect to the listener. The acoustic principles underlying this determination can best be described in conjunction with FIGS. 8A and 8B. FIGS. 8A and 8B are intended to show such acoustic principles with respect to changes in azimuth of a speaker system.

FIG. 8A depicts a top view of a sound reproduction environment having speakers 200 and 202 placed slightly forward of, and pointed towards, the sides of a listener 204. The speakers 200 and 202 are also placed below the listener 204 at a elevational position similar to that of the speakers 46 shown in FIG. 2. Reference planes A and B are aligned with ears 206, 208 of the listener 204. The planes A and B are parallel to the listener's line-of-sight as shown.

It is assumed that sound reproduced by the speakers 200 and 202 within the audio environment of FIG. 8A will suffer some spectral distortion and/or amplitude distortion before impinging upon the ears 206 and 208. Such distortion may, for example, be represented by the curve 64 shown in FIG. 4B which when played through the speakers 200 and 202 creates a spatially distorted image. By compensating for the spectral distortion through use of the image correction circuit 22, an audio signal played through the speakers 200 and 202 will convey an apparent sound image to the listener 204. In the example of FIG. 8A, the apparent sound image will have a different elevation than the actual sound source. Further, by applying the image enhancement aspects of the present invention, this apparent sound image will be spatially-enhanced to broaden the apparent image. The resulting image will correspond to an enhanced image emanating from speakers 210 and 212 depicted in phantom.

Enhancement of the apparent sound image is accomplished by selectively equalizing the difference signal, i.e., the gain of the difference signal will vary with frequency. The curve 190 of FIG. 7 represents the desired level of difference-signal equalization with actual speaker locations corresponding to the phantom speakers 210 and 212. However, when speakers are pointed inwardly towards a listener, like the speakers 200 and 202 of FIG. 8A, acoustic perceptions are significantly altered which requires a modified level of difference-signal equalization. Specifically, direct-field sound emanating from the speakers 200 and 202 enters the listener's ears 206 and 208 at an angle $\theta_1$ with respect to the reference planes A and B. As the speakers are placed further forward the angle $\theta_1$ decreases. Referring now to FIG. 8B, a second sound reproduction system is shown having a pair of speakers 214 and 216 placed forward and below the listener 204. In this configuration, direct-field sound emanating from the speakers 214 and 216 enters the listener's ears 206 and 208 at an angle of incidence $\theta_2$ which is smaller than $\theta_1$.

Most speakers can be characterized by an angle of dispersion, or beaming characteristic, in which sound is radiated. The angle of dispersion for sounds of a given frequency will decrease as the frequency increases. As a consequence, the listener 204 begins to fall outside of the normal beaming aspects of the speakers 200 and 202 as they are moved forward to the locations of FIG. 8B. When this occurs, the listener 204 will gradually lose perception of a mid-range and upper mid-range of frequencies. Moreover, this effect may be magnified with small speakers because smaller speakers typically have an angle of dispersion narrower than larger speakers.

To compensate for the loss of mid to upper mid-range of audio frequencies, the gain of the difference signal is correspondingly boosted in the same frequency range. As the actual position of the speakers 200 and 202 is moved forward, the mid-range gain compensation must be increased. Because the perspective equalization curve 190 relatively attenuates this same mid band of frequencies, the level of attenuation is modified to account for the inwardly-projected speakers of FIGS. 8A and 8B. Accordingly, the curve 196 of FIG. 7 may be used to spatially enhance the system of FIG. 8B to generate the apparent source of speakers 218 and 220, while the curve 192 may be sufficient to spatially enhance the system of FIG. 8A. By boosting the difference signal among the mid-range, or upper mid-range frequencies, an apparent sound image can be properly oriented with respect to the listener 204. Proper orientation of the sound image has the apparent effect of inwardly rotating the speakers 200, 202, 214 and 216 to direct an apparent dispersion beam at the listener 204.

Stereo Image Correction Circuit

Figure 9:
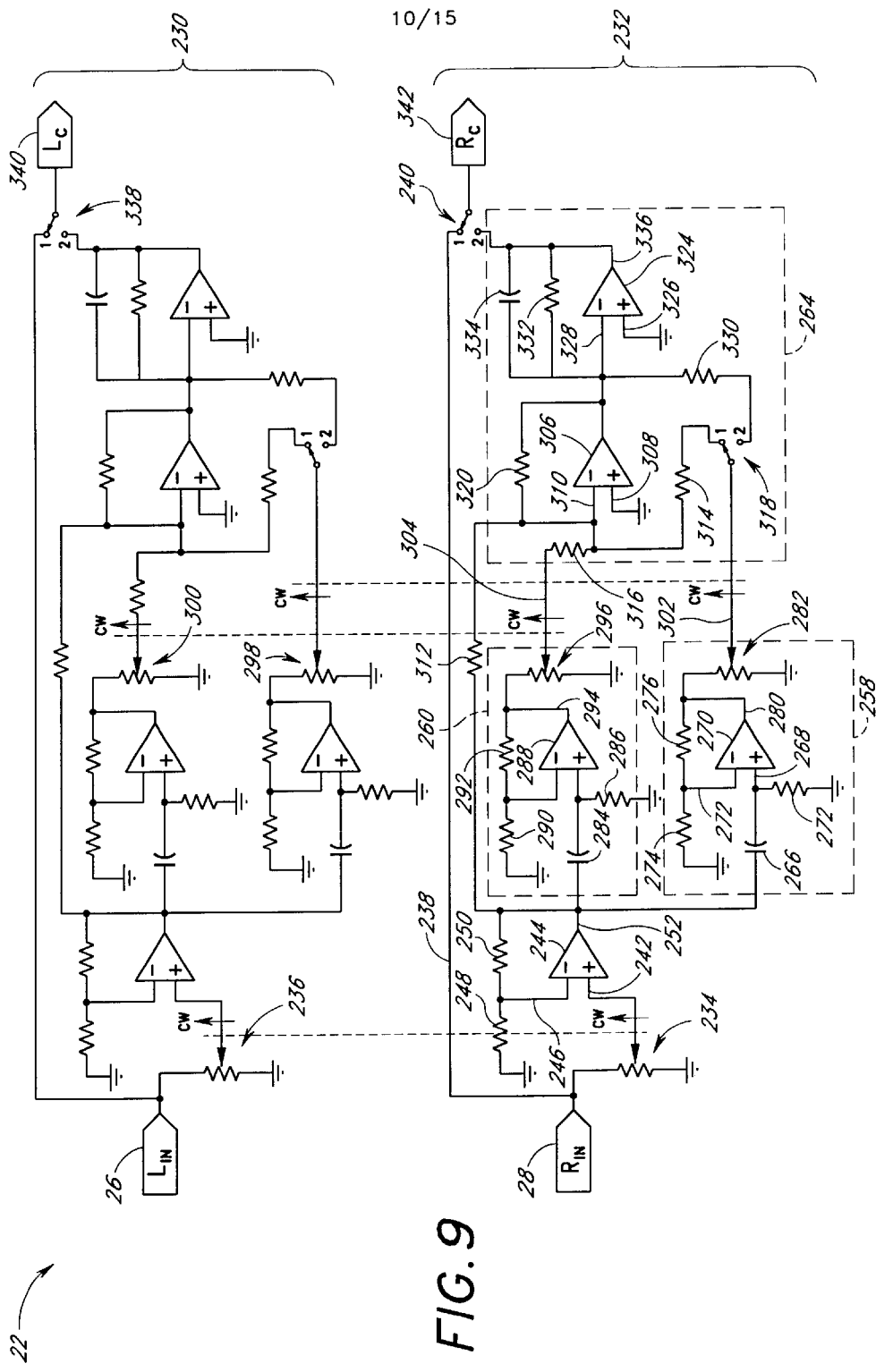
FIG. 9 is a schematic diagram of an energy-correction circuit for altering the sound pressure level of an audio signal across a broad frequency range.

FIG. 9 is a detailed schematic diagram of a preferred embodiment of the stereo image correction circuit 22. The circuit 22 is separated into a left signal correction circuit 230 and a right signal correction circuit 232. The left and right correction circuits 230 and 232 are intended to perform the same signal conditioning upon their respective input signals 26 and 28. Accordingly, the specifications for the left signal correction circuit 230 should be identical to those of the right signal correction circuit 232. For purposes of simplicity, only the circuit connections and functional operations of the right signal correction circuit 232 will be explained.

The right stereo signal 28 is input by the right signal correction circuit 232 and transferred to a variable resistor 234. The variable resistor 234, or potentiometer, is ganged to a similar variable resistor 236 in the left signal correction circuit 230. This is to ensure that any adjustments made to the right signal correction circuit 232, or vice versa, will affect both circuits 230 and 232 equally. The right stereo signal is also transmitted along a path 238 to a terminal "1" of a switch 240 which, depending upon the position of the switch 240, operates as a bypass preventing any equalization of the stereo signal 28.

From the variable resistor 234, the input signal is connected to a non-inverting input 242 of a first amplifier 244. The inverting input 246 is connected to ground via a resistor 248 and is also connected to one end of a feedback resistor 250. An opposite end of the feedback resistor 250 is connected to an output 252 of the amplifier 244.

The output 252 is transmitted to three separate locations of the circuit 232. Specifically, the output 252 is connected to high-pass filtering circuits 258 and 260, and is also connected to a mixing circuit 264. With respect to circuit 258, the signal from the output 252 is transmitted through a capacitor 266 to a non-inverting input 268 of an amplifier 270. The input 268 is also connected to ground through a resistor 272. An inverting input 272 of the amplifier 270 is connected to both ground via resistor 274, and connected to an output 280 of the amplifier 270 through a feedback resistor 276. The filtering circuit 260 is configured similarly to circuit 258 with components 284, 286, 288, 290, 292, and 294.

The output 280 and a corresponding output 294 of the amplifier 288 are fed to a pair of variable resistors 282 and 296, respectively. The resistor 282 is ganged with a variable resistor 298 of the left signal correction circuit 230, while the variable resistor 296 is similarly ganged with a variable resistor 300. Each of the resistors 282 and 296 has a respective output 302 and 304.

The mixing circuit 264 comprises an amplifier 306 having a non-inverting input 308 connected to ground. Signals provided at the outputs 302, 304, and 252 enter the mixing circuit 264 and are transmitted to an inverting input 310 of the amplifier 306. Resistors 312, 314, and 316 are connected between the inverting input 310 and the outputs 252, 302, and 304, respectively. In addition, the signal at the output 302 is transmitted to the amplifier 306 via a switch 318 which may be a two-position manual or automatic selection switch. A feedback resistor 320 connects the inverting input 310 to an output 322 of the amplifier 308.

An amplifier 324 has a non-inverting input 326 connected to ground potential, and an inverting input 328 connected to the output 322. In addition, the inverting input is connected to the switch 318 through a resistor 330. The signal at output 302 is transmitted to the input 328 via the resistor 330 when the switch 318 is in position 2. A resistor 332 and a capacitor 334 are connected in parallel between the input 328 and an output 336 of the amplifier 324. The output 336 is in turn connected to a position "21" of the switch 240. The switch 240 is preferably ganged with a similar bypass switch 338.

The left and right energy-correction circuits 230 and 232 modify amplitude components of the input stereo signals to generate an energy-corrected left stereo signal 340 and an energy-corrected right stereo signal 342. Again, for simplicity, reference will only be made to generation of the energy-corrected right signal 342. It can be easily appreciated, however, that the same principles apply to generation of the energy-corrected left signal 340.

In operation, the stereo signal 28 is input and processed by the circuit 232 to correct for distorted sound pressure levels created when the signal 28 is played through an audio reproduction system. Initially, the variable resistor 234 allows for adjustment of the input signal level. Such an adjustment may be required to control the overall gain of the circuit 232, or in some instances to boost the input signal 28 if it has been attenuated significantly by a preceding circuit. The resistor 234 may be a standard 10 kohm clockwise potentiometer which is ganged with the variable resistor 236.

The amplifier 244 is configured as a voltage follower to act as an isolation buffer between the input signal 28 and the rest of the circuit 232. The buffered level-adjusted signal appearing at the output 252 is fed to the circuit 258 where the signal is passed through a single-order high-pass filter having a corner frequency of approximately 5 kHz. In a preferred embodiment, the high-pass filtering is accomplished by the RC combination of the capacitor 266 having an impedance of 3900 picofarads and the resistor 272 having an impedance of 10 kohms. The resultant high-pass filtered signal appearing at the input 268 is buffered through the amplifier 270 operating at unity gain. The amplitude of the signal appearing at the output 280 may then be increased or decreased by adjusting the variable resistor 282 accordingly.

Similarly, the circuit 260 inputs the signal from the output 252 and processes the signal through the RC filter combination of the capacitor 284 and the resistor 286. The series connection of the capacitor 284 and the resistor 286 also operates as a high-pass filter but with a corner frequency of approximately 500 Hz. This is obtained by choosing an impedance of 0.022 microfarads for the capacitor 284 and a resistance of 10 kohms for the resistor 286. The filtered input signal is then buffered by the amplifier 288 and fed to the level-adjusting variable resistor 296.

The filtered signals exiting the resistors 282 and 296 are fed to the mixing circuit 264 along paths 302 and 304, respectively. In addition, the original signal 28, affected only by a gain adjustment, is also transferred to the mixer 264 via the resistor 312. The mixer combines all three inputted signals to generate an energy-corrected output signal.

Various levels of spatial correction, as represented in FIGS. 6A–6C, are obtained through adjustment of the ganged resistor pairs 296/300 and 282/298. Specifically, the lower frequency correction curves of FIG. 6A can be obtained by measuring the gain at the output 336 while the variable resistor 282, which affects higher frequency correction, is set to a minimum. In this setting, the switch 318 will be grounded and no correction of the higher frequencies will occur. Accordingly, the range of lower frequency correction is achieved by adjusting the resistor 296. In this manner, the inverting amplifier 306 combines the filtered signal at the path 304 with the original signal from the output 52. The curve 152 of FIG. 6A represents unity gain whereby the circuit 232 merely passes the input signal 28 without any spatial correction. This results when the resistor 296 is set at zero impedance thereby grounding the input 310 of the amplifier 306. As the level of the resistor 296 is increased, more of the filtered signal is added to the original signal providing spatial correction in the 100 to 1000 Hz range. When the resistor 296 is set at maximum resistance, full spatial correction among the lower frequencies is achieved as evidenced by the curve 150 of FIG. 6A.

The curves of FIG. 6B represent those obtained by eliminating any correction applied by the circuit 260, i.e., setting the resistor 296 to zero impedance, and maintaining the switch 318 in position 1 as shown. Adjustment of the variable resistor 282 provides the desired boost among higher frequencies as graphically represented in FIG. 6B. Conversely, attenuation of the higher frequencies, as graphically represented by FIG. 6C, is obtained by setting the switch 318 in position 2. In this position, the output from the filtering circuit 258 is provided to a separate inverting amplifier 324. The amplifiers 306 and 324 then combine the filtered signals from the paths 302 and 304 in successive and inverted stages. Specifically, the signal from path 304 and the signal from the output 252 are first combined by the amplifier 306. The resultant signal at the output 322, which is now inverted, is then combined with the output from the resistor 282.

When combined by the amplifier 306, the gain of the filtered signals from the paths 302 and 304, relative to the input signal, is determined by the impedance ratio of the feedback resistors 320 and 332 with the resistors 314 and 316. For most audio reproduction environments having distorted sound pressure levels, these resistors can be set to provide a maximum gain ratio of approximately 3:1 for the filtered signals to the input signal. In a preferred embodiment, the resistors 320 and 332 will have an impedance of about 10 kohms while the resistors 314 and 316 have an impedance of approximately 3.32 kohms. Through adjustment of the variable resistors 282 and 296, and through selection of the switch 318, all of the levels of spatial correction represented in FIG. 6D can be obtained.

The circuit of FIG. 9 represents only a preferred embodiment of a stereo image correction circuit. It can be appreciated by a person of ordinary skill in the art that variations in the design of the circuit 22 may be made to account for specific reproduction environments without departing from the intended scope of the invention. For example, the energy-correction frequency ranges of 0.1–1 kHz ("low" frequency correction) and 1 khz–10 kHz ("high" frequency correction) may be varied through selection of RC impedance combinations within the filter circuits 258 and 260. In some instances it may be desirable to have three or more such energy-correction frequency ranges. It should also be noted that the capacitor 334 is intended to prevent oscillation in the circuit 22 which may result from stray capacitance present in a discrete implementation. The capacitor 334 may not be needed in a PC board or semiconductor implementation of the circuit 22.

Stereo Image Enhancement Circuit

Figure 10:
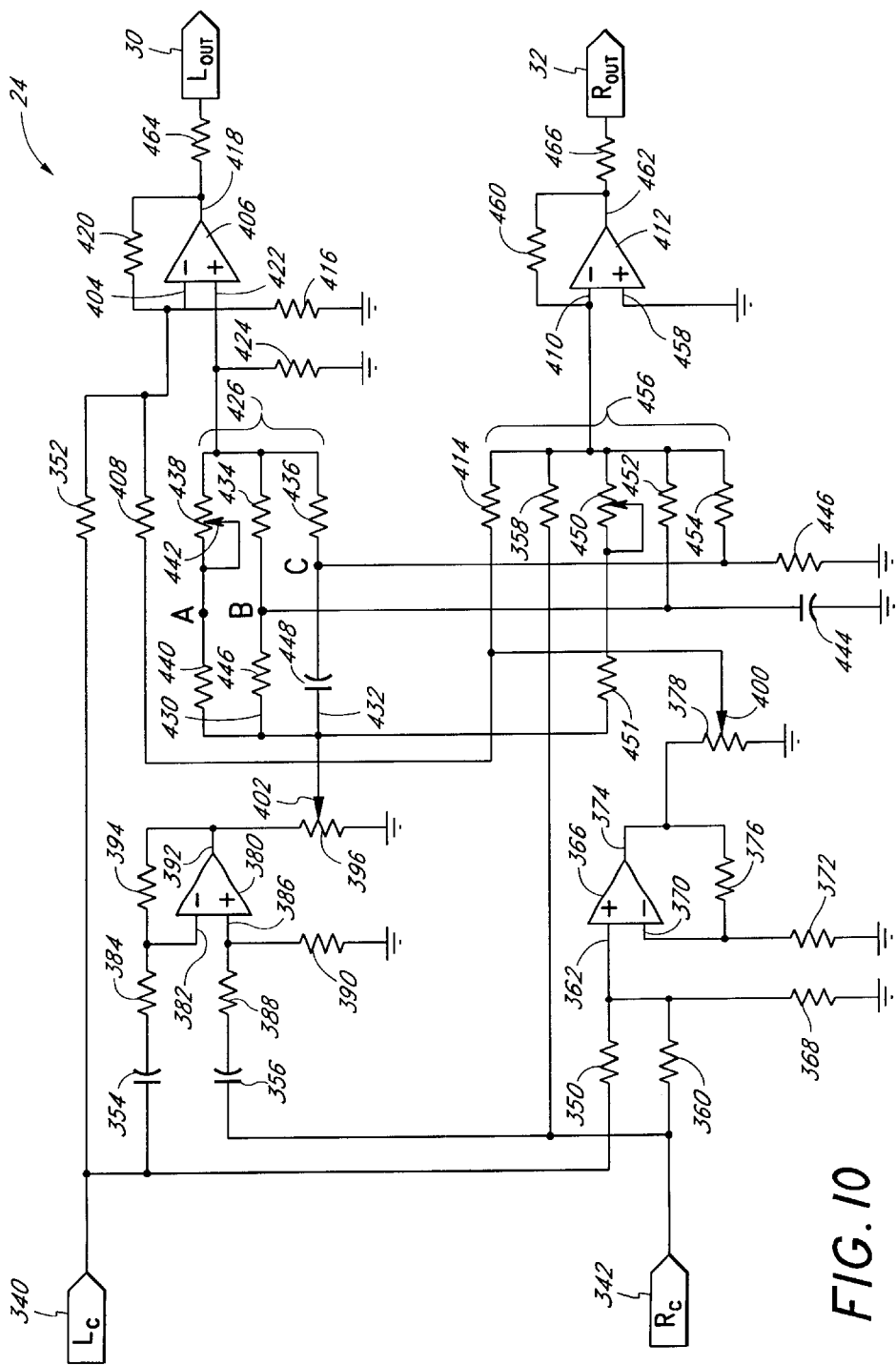
FIG. 10 is a schematic diagram of a stereo image enhancement circuit for use in conjunction with the energy-correction circuit of FIG. 9.

FIG. 10 is a schematic diagram of the stereo image enhancement circuit 24. The circuit 24 is designed to broaden the stereo image of the corrected left and right signals $L_c$ and $R_c$. In accordance with a preferred embodiment, the energy-corrected left signal 340 is fed to a resistor 350, a resistor 352, and a capacitor 354. The energy-corrected right signal 342 is fed to a capacitor 356 and resistors 358 and 360.

The resistor 350 is connected to a non-inverting terminal 362 of an amplifier 366. The same terminal 362 is also connected to the resistor 360 and a resistor 368. The amplifier 366 is configured as a summing amplifier having an inverting terminal 370 connected to ground via a resistor 372. An output 374 of the amplifier 366 is connected to the inverting terminal 370 via a feedback resistor 376. A sum signal ($L_c+R_c$), representing the sum of the left and right signals 340 and 342, is generated at the output 374 and fed to one end of a variable resistor 378 which is grounded at an opposite end. For proper summing of the signals 340, 342 by the amplifier 366, the values of resistors 350, 360, 368, and 376 in a preferred embodiment are approximately twice that of the resistor 372.

A second amplifier 380 is configured as a "difference" amplifier. The amplifier 380 has an inverting terminal 382 connected to a resistor 384 which is in turn connected in series to the capacitor 354. Similarly, a positive terminal 386 of the amplifier 380 receives the signal 340 through the series connection of a resistor 388 and the capacitor 356. The terminal 386 is also connected to ground via a resistor 390. An output terminal 392 of the amplifier 380 is connected to the inverting terminal through a feedback resistor 394. The output 392 is also connected to a variable resistor 396 which is in turn connected to ground. Although the amplifier 380 is configured as a "difference" amplifier, its function may be characterized as the summing of the right input signal with the negative left input signal to generate a difference signal ($L_c-R_c$). Accordingly, the amplifiers 366 and 380 form a summing network for generating a sum signal and a difference signal, respectively.

The two series connected RC networks comprising elements 354/384 and 356/388, respectively, operate as high-pass filters which attenuate the very low, or bass, frequencies of the input signals $L_c$ and $R_c$. These RC filters correspond to the device 98 of FIG. 5. To obtain the proper frequency response according to the equalization curves of FIG. 7, the cutoff frequency, $w_c$, or −3 dB frequency, for the device 98 should be approximately 100 Hz. Accordingly, in a preferred embodiment, the capacitors 354 and 356 will have a capacitance of 0.1 micro-farad and the resistors 384, 388 will have an impedance of approximately 33.2 kohms. Then, by choosing values for the feedback resistor 394 and the attenuating resistor 390 such that:

$$\frac{R_{120}}{R_{128}} = \frac{R_{116}}{R_{124}} \qquad (3)$$

the output 392 will represent the difference signal amplified by a gain of two. The phase of the signal at the output 392 will actually be inverted providing the signal $R_c-L_c$.

The particular phase of the difference signal is relevant when determining the final makeup of the output signal. As is common in the art, use of the term "difference signal" herein denotes both $L_c-R_c$ and $R_c-L_c$, which are merely 180 degrees out-of-phase. As can be appreciated by one of ordinary skill in the art, the amplifier 380 could be configured so that the "left" difference signal, $L_c-R_c$, appears at the output 392, instead of $R_c-L_c$, as long as the difference signals at the left and right outputs remain out-of-phase with respect to each other.

As a result of the high-pass filtering of the inputs, the difference signal at the output 392 will have attenuated low-frequency components below approximately 125 Hz decreasing at a rate of 6 dB per octave. It is possible to filter the low frequency components of the difference signal within the equalizer 120 (shown in FIG. 5), instead of using the filter 98. However, because the filtering capacitors at low frequencies must be fairly large, it is preferable to perform this filtering at the input stage to avoid loading of the preceding circuit.

The variable resistors 378 and 396, which may be simple potentiometers, are adjusted by placement of wiper contacts 400 and 402, respectively. The level of difference signal present in the resultant output signals may be controlled by manual, remote, or automatic adjustment of the wiper contact 402. Similarly, the level of sum signal present in the enhanced output signals is determined in part by the position of the wiper contact 400. The setting of the contact 402 is referred to by the applicant as the "SPACE" control for the resulting sound image, while the setting of the contact 400 is the "CENTER" control.

The sum signal present at the wiper contact 400 is fed to an inverting input 404 of a third amplifier 406 through a series-connected resistor 408. The same sum signal at the wiper contact 400 is also fed to an inverting input 410 of a fourth amplifier 412 through a separate series-connected resistor 414. The amplifier 406 is configured as a difference amplifier with the inverting terminal 404 connected to ground through a resistor 416. An output 418 of the amplifier 406 is also connected to the inverting terminal 404 via a feedback resistor 420.

A positive terminal 422 of the amplifier 406 is a summing junction for a group of signals along signal paths 426. The terminal 422 is also connected to ground via a resistor 424. The level-adjusted difference signal is transmitted from the wiper contact 402 and split through paths 428, 430, and 432. This results in three separately-conditioned difference signals appearing at points A, B, and C, respectively. The signals at points A, B, and C, correspond with those of the outputs 132, 136, and 134 of FIG. 5, respectively. The conditioned difference signals at points B and C are transferred to the positive terminal 422 via fixed resistors 432 and 436 as shown. The conditioned difference signal at point A is transmitted through a variable resistor 438 to the terminal 422.

The signal at node B represents a filtered version of the level-adjusted difference signal appearing across a capacitor 444 which is connected to ground. The RC network of the capacitor 444 and a resistor 446 operate as a low-pass filter for the difference signal at the wiper contact 402. This low-pass filter corresponds with the filter 124 of FIG. 5. In accordance with a preferred embodiment, the cutoff frequency of this RC network is approximately 200 Hz. Such a cutoff frequency can be realized if the resistor 446 is 1.5 kohms, the capacitor 444 is 0.47 microfarads, and the drive resistor 434 is 20 kohms.

At node C, the difference signal is filtered by the RC combination of a resistor 446, connected between node C and ground, and a capacitor 448 connected between node C and the wiper contact 402. Such a filter corresponds with the high-pass filter 126 of FIG. 5. The resultant difference-signal component is fed through the drive resistor 436 to the terminal 422 of the amplifier 406. The high-pass filter 126 is designed with a cutoff frequency of approximately 7 Khz and a gain, relative to that of node B, of −6 dB. Such a cutoff frequency can be realized if the capacitor 448 has an impedance of 4700 picofarads, and the resistor 180 has a resistance of 3.74 kohms.

At point A, the level-adjusted difference signal from the wiper contact 402 is transferred to the resistor 440 without selective equalization. Accordingly, the signal at point A is merely attenuated evenly across all frequencies. The signal at point A is further attenuated by the impedance of the variable resistor 438, which is adjusted by movement of an associated wiper contact 442.

Adjustment of the variable resistor 438, which may be a standard 100 kohm potentiometer, varies the level of stereo enhancement to correct for speaker orientation with respect to a listener. By decreasing the resistance of the variable resistor 438, the base level of difference signal is increased. This causes a corresponding amplitude increase in a midrange of frequencies to partially overcome attenuation of these frequencies by the filters 124 and 126 (shown in FIG. 5). Referring again to FIG. 7, the perspective equalization curve applied to the difference signal varies from the curve 190 to the curve 198 as the impedance of the resistor 438 decreases. In this manner, the level of selective difference-signal equalization may be partially or almost totally reduced. That is, amplitude adjustment as a function of frequency will be significantly reduced across a mid band of frequencies. Selection of the appropriate curve is determined in accordance with acoustic principles discussed above in connection with FIGS. 8A and 8B.

If the stereo image correction circuit 22 and the stereo image enhancement circuit 24 are applied in a known reproduction environment, then the variable resistor 438 and the resistor 440 may be replaced by a single fixed resistor having the desired impedance. In a preferred embodiment, the total resistance of the resistors 438 and 440 will vary between 20 and 100 kohms to account for most reproduction environments. With such a design, the resistor 424 has an (impedance of approximately 27.4 kohms.

The modified difference signals present at circuit locations A, B, and C are also fed into the inverting terminal 410 of the amplifier 412 through a variable resistor 450 and a fixed resistor 451 series combination, and through fixed resistors 452 and 454, respectively. These modified difference signals, the sum signal and the energy-corrected right signal 342 are transmitted along a group of signal paths 456. The signals from the group 456 are combined at the terminal 410 of the amplifier 412. The amplifier 412 is configured as an inverting amplifier having a positive terminal 458 connected to ground and a feedback resistor 460 connected between the terminal 410 and an output 462. The resistance level of the variable resistor 450 is adjusted to the same level as that of the resistor 438. To achieve proper summing of the signals by the inverting amplifier 412, the resistor 452 has an impedance of 20 kohms, and the resistor 454 has an impedance of 44.2 kohms. The exact values of the resistors and capacitors in the stereo enhancement system 24 may be altered as long as the proper ratios are maintained to achieve the correct level of enhancement. Other factors which may affect the value of the passive components are the power requirements of the enhancement system 24 and the characteristics of the amplifiers 370, 380, 406, and 412.

The signal at the output 418 of the amplifier 406 is fed through a drive resistor 464 to produce the enhanced left output signal 30. Similarly, the signal at the output 462 of the amplifier 412 travels through a drive resistor 466 to produce the enhanced right output signal 32. The drive resistors will typically have an impedance on the order of 200 ohms.

In operation, the difference signal components found at points A, B, and C are recombined at the terminal 422 of the difference amplifier 406, and at the terminal 410 of the amplifier 412, to form a processed difference signal $(L_c-R_c)$. Ideally, the desired range of perspective curves for generating $(L_c-R_c)p$ is characterized by a maximum gain at approximately 125 Hz and above 7 Khz, and a minimum gain between approximately 2100 Hz and 5 kHz. The processed difference signal is also combined with the sum signal and either the left or right signal to generate output signals $L_{out}$ and $R_{out}$. The enhanced left and right output signals can be expressed by the mathematical equations (1) and (2) recited above. The value of $K_1$ in equations (1) and (2) is controlled by the position of the wiper contact 400 and the value of $K_2$ is controlled by the position of the wiper contact 402.

Figure 11:
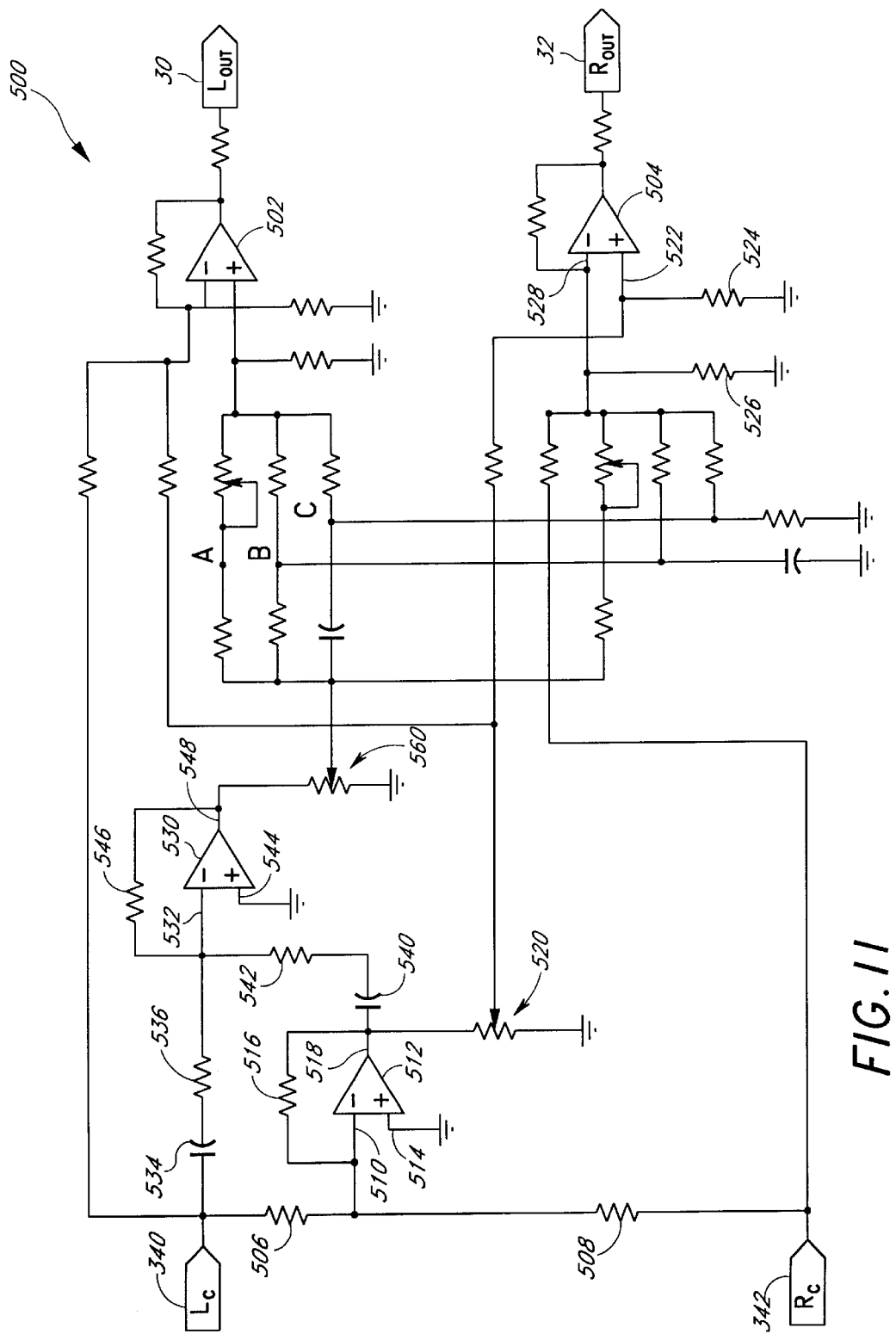
FIG. 11 is a schematic diagram of an alternative embodiment of a stereo image enhancement circuit for use in conjunction with the energy-correction circuit of FIG. 9.

An alternative embodiment of the stereo image enhancement circuit 24 is depicted in FIG. 11. The circuit of FIG. 11 is similar to that of FIG. 10 and represents another method for selectively equalizing a difference signal generated from a pair of stereo audio signals. The stereo image enhancement circuit 500 generates sum and difference signals differently than the circuit 24 of FIG. 10.

In the circuit 500, the left and right energy-corrected signals 340 and 342 are fed into negative inputs of mixing amplifiers 502 and 504, respectively. To generate the sum and difference signals, however, the left and right signals 340 and 342 are connected to an inverting terminal 510 of a first amplifier 512 through respective resistors 506 and 508. The amplifier 512 is configured as an inverting amplifier with a grounded input 514 and a feedback resistor 516. The sum signal, or in this case the inverted sum signal, $-(L_c+R_c)$, is generated at an output 518. The sum signal is then fed to the remaining circuitry after being level-adjusted by a variable resistor 520. Because the sum signal in the circuit 500 is inverted, it is fed to a non-inverting input 522 of the amplifier 504. Accordingly, the amplifier 504 now requires a current-balancing resistor 524 placed between the non-inverting input 522 and ground potential. Similarly, a current-balancing resistor 526 is placed between an inverting input 528 and ground potential to achieve correct summing by the amplifier 504 to generate the output signal 32.

To generate a difference signal, an inverting summing amplifier 530 receives the left input signal and the sum signal at an inverting input 532. The input signal 340 is passed through a capacitor 534 and a resistor 536 before arriving at the input 532. Similarly, the inverted sum signal at the output 518 is passed through a capacitor 540 and a resistor 542. The RC networks created by components 534/536 and components 540/542 provide the bass frequency filtering of the audio signal as described in conjunction with a preferred embodiment.

The amplifier 530 has a grounded non-inverting input 544 and a feedback resistor 546. With this alternate configuration of FIG. 11, a difference signal, $R_c-L_c$, is generated at an output 548 of the amplifier 530. The difference signal is then adjusted by the variable resistor 560 and fed into the remaining circuitry. Acceptable impedance values for the circuit 500 include 100 kohms for the resistors 506, 508, 516, and 536, impedance values of 200 kohms for the resistors 542 and 546, a capacitance of 0.15 micro-farads for the capacitor 540, and a capacitance of 0.33 micro-farads for the capacitor 534. Except as described above, the remaining circuitry of FIG. 11 is the same as that disclosed in FIG. 10.

The stereo image enhancement system 24 may be constructed with only four active components, typically operational amplifiers corresponding to amplifiers 366, 380, 406, and 412. These amplifiers are readily available as a quad package on a single semiconductor chip. Additional components needed to complete the stereo enhancement system 24 include only 29 resistors (excluding drive resistors) and 4 capacitors. The circuit 500 of FIG. 11 can be manufactured with a quad amplifier, 4 capacitors, and only 28 resistors, including the potentiometers. The circuits 24 and 500 can be formed as a multi-layer semiconductor substrate, i.e., an integrated circuit package.

Apart from the embodiments depicted in FIGS. 10 and 11, there are additional ways to interconnect the same components to obtain perspective enhancement of stereo signals in accordance with the present invention. For example, a pair of amplifiers configured as difference amplifiers may receive the left and right signals, respectively, and may also each receive the sum signal. In this manner, the amplifiers would generate a left difference signal, $L_c-R_c$, and a right difference signal, $R_c-L_c$, respectively.

The stereo image enhancement provided by the enhancement device 24 is uniquely adapted to take advantage of high-quality stereo recordings. Specifically, unlike previous analog tape or vinyl album recordings, today's digitally stored sound recordings may contain difference signal, i.e. stereo, information throughout a broader frequency spectrum, including the bass frequencies. Excessive amplification of the difference signal is avoided within these frequencies by limiting the amount of difference-signal boost in the bass frequencies.

Figure 12:
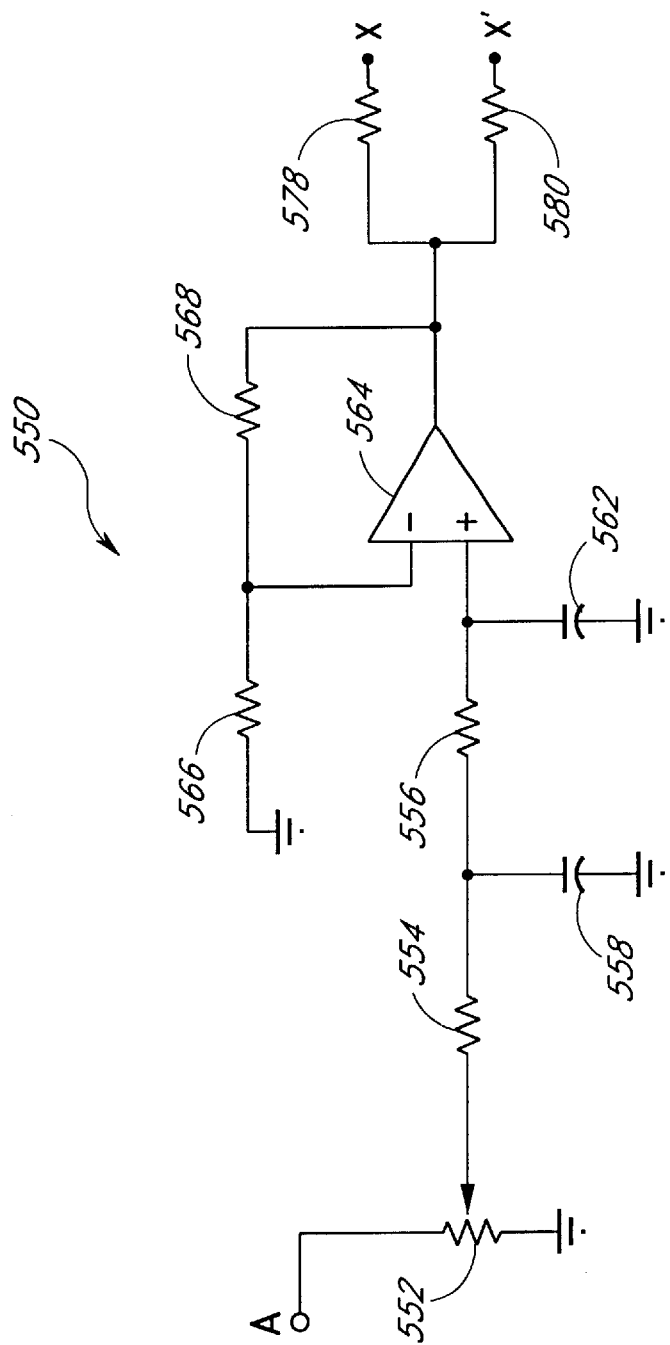
FIG. 12 is a schematic diagram of a bass-boost circuit for use in an alternative embodiment of the present invention.

However, it may be desirable, depending on the sound reproduction environment, to boost bass frequencies of the audio signal to compensate for any loss of bass frequencies which may occur as a result of sound image relocation and orientation. FIG. 12 depicts a bass-boost circuit 550 for use in an alternative embodiment of the present invention to compensate for any such reduction in bass response. The bass-boost circuit 550 operates upon the sum signal where most of the bass, i.e., very low frequency, information resides.

The circuit 550 has an input, A, receiving the sum signal through connection to the output 374 of the amplifier 366 of FIG. 10. The level of the sum signal is adjusted by a variable resistor 552 which may be a 10 kohm potentiometer. The variable resistor 552 may be used as a manual user-adjust setting, or if the desired amount of bass boost is known, the resistor 552 may be replaced by the appropriate fixed resistor. The level-adjusted sum signal exiting the resistor 552 is then passed through a second-order low-pass filter comprised of the resistors 554, 556 and the capacitors 558, 562. The resultant filtered signal appears at a non-inverting terminal of an operational amplifier 564. The amplifier 564 is configured as a voltage follower to avoid loading of the second-order filter. In a preferred embodiment, the gain of the amplifier 564 is set to a maximum of two through selection of equal-value resistors 566 and 568 which are connected from the inverting terminal to ground and from the inverting terminal to an output, respectively, creating a feedback loop. In a preferred embodiment, the resistors 554, 566, and 568 are 10 kohm resistors, the resistor 556 is a 100 kohm resistor, the capacitor 558 has an impedance of 0.1 millifarads, and the capacitor 562 has an impedance of 0.01 millifarads. Selection of the foregoing component values allow for selective amplification of bass frequencies below approximately 75 hertz through adjustment of the resistor 552.

The output of the amplifier 564 is split into two paths each containing a respective fixed resistor 578 and 580. One path, having an output labelled X, is connected to the inverting terminal 404 of the amplifier 406 of FIG. 10. Similarly, the output labelled X' is connected to the inverting terminal 410 of the amplifier 412. In operation, further boost of the bass frequencies may be obtained by varying the ratio of the resistors 578, 580 to the resistors 420 and 460, respectively. For example, in a preferred embodiment, the value of the resistors 578 and 580 will be one-half those of 420 and 426, thus allowing for a gain of two through the amplifiers 406 and 412 of FIG. 10. Accordingly, the total gain of the bass-boost circuit 550 may be varied through a maximum gain of 4 down to zero gain by adjusting the resistor 552.

It can be appreciated that a variety of stereo enhancement systems can be substituted for that of the system 24 as desired. For example, an embodiment of the systems disclosed in U.S. Pat. Nos. 4,748,669 and 4,866,774 equalize the relative amplitudes of both the difference and the sum signals in specific frequency bands.

In addition to automobiles, the present invention is suitable for a wide variety of enclosed or outdoor audio reproduction environments where reproduced sound is spatially distorted from the perception of a listener. The present invention may also be used in those environments which do not have listeners situated in a fixed position.

Figure 13:
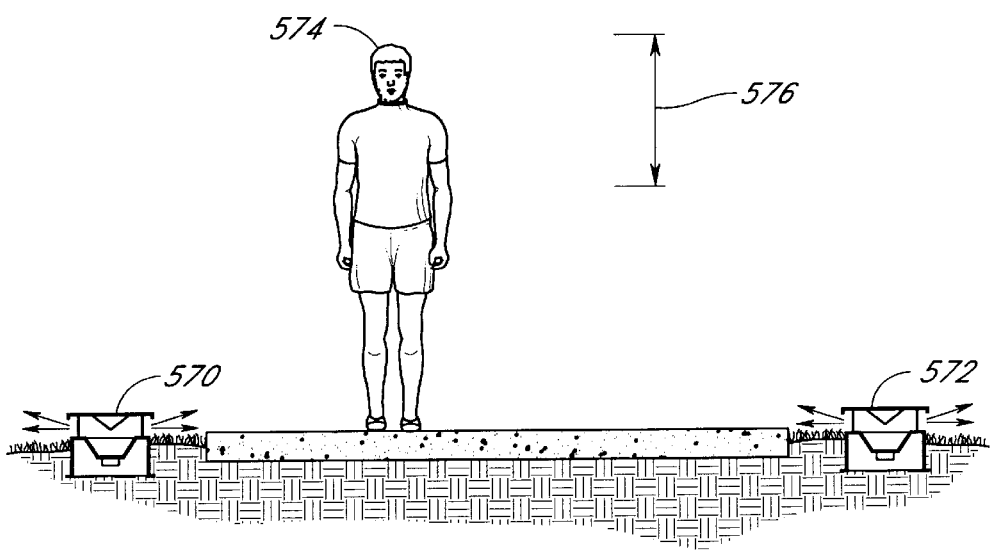
FIG. 13 is a diagram of a first alternative audio reproduction environment suitable for application of the present invention.

FIG. 13 depicts one such outdoor audio reproduction environment having outdoor speakers 570 and 572 which create a spatially distorted stereo image with respect to a listener 574. The speakers 570 and 572 may be positioned near ground level, as shown in FIG. 13, or in various other positions to provide stereo sound to a wide outdoor listening area. The positioning of the outdoor speakers 570 and 572 will no doubt be determined in part by factors other than optimum acoustic response. Such positioning, whether it be near the ground, over-head, or in surrounding foliage, may distort the pressure level of emanating sound over certain frequencies as perceived by listeners. The resulting distorted sound image can be corrected by application of the stereo image correction circuit 22, and then enhanced by the stereo image enhancement circuit 24 in accordance with the principles discussed herein. As a result, an apparent sound image can be created which falls within a desired listening range 576.

Some outdoor speakers, like the speakers 570 and 572 of FIG. 13, are omnidirectional to account for the wide listening area and the mobility of the listener 574. In such an audio reproduction environment, there is no need to compensate for a reduction in a mid to upper mid-range of frequencies as discussed in connection with FIGS. 8A and 8B. Accordingly, optimum enhancement results are achieved in the environment of FIG. 13 by applying the perspective curve 190 of FIG. 7 to enhance energy-corrected stereo signals played through the speakers 570 and 572.

Figure 14:
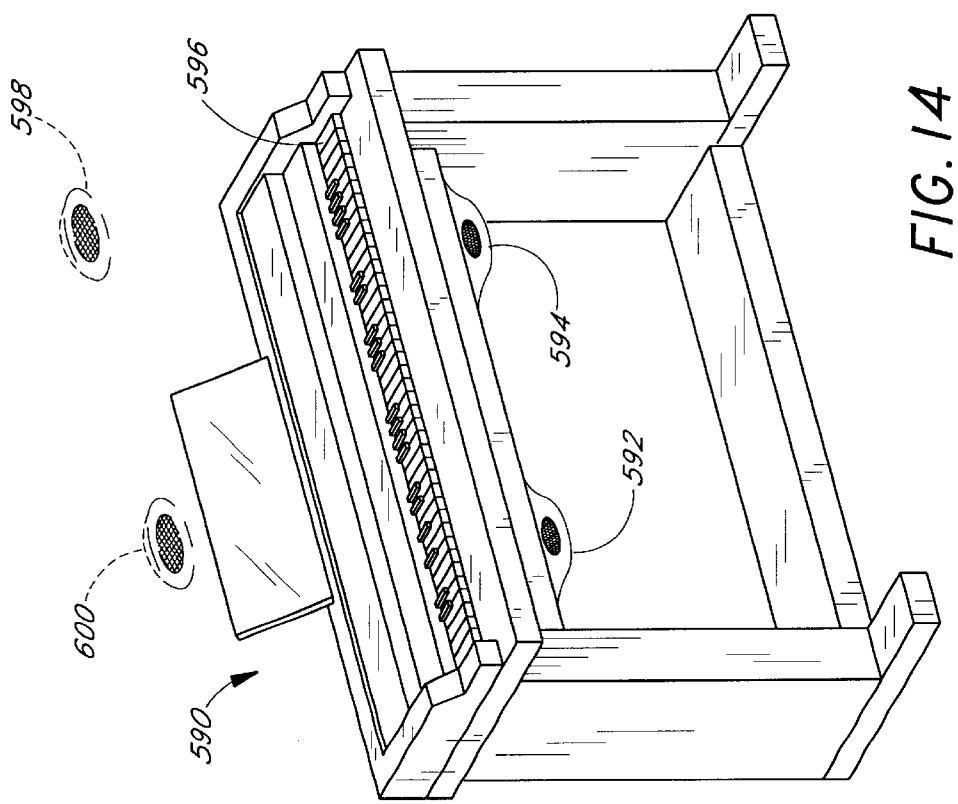
FIG. 14 is a perspective view of a second alternative audio reproduction environment suitable for application of the present invention.

FIG. 14 depicts another audio reproduction environment containing an implementation of the acoustic correction apparatus 20. Specifically, an electronic keyboard apparatus 590 is shown having speakers 592 and 594 placed below a keyboard 596. To an operator (not shown) situated in front of the electronic keyboard 590, the speakers 592 and 594 are located at an acoustically-undesirable position beneath the operator's ears. To correct for spatial distortion which may result from such placement of the speakers 592 and 594, the acoustic correction apparatus 20 modifies audio signals generated by the electronic keyboard 590. In accordance with the principles discussed herein, a relocated apparent sound image may thus be generated as emanating from apparent speakers 598 and 600 depicted in phantom. Unlike the environment of FIG. 8B, the level of orientation required for the audio reproduction environment of FIG. 14 will likely be minimal due to the positioning of the speakers 592 and 594 towards the operator. Accordingly, the curve 190 of FIG. 7 may be suitable to spatially enhance the relocated sound image.

The entire acoustic correction apparatus 20 disclosed herein may be readily implemented by either (1) a digital signal processor, (2) with discrete circuit components, (3) as a hybrid circuit structure, or (4) within a semiconductor substrate having terminals for adjustment of the appropriate resistors. Adjustments by a user currently include the level of low-frequency and high-frequency energy correction, various signal-level adjustments including the level of sum and difference signals, and orientation adjustment.

Through the foregoing description and accompanying drawings, the present invention has been shown to have important advantages over current acoustic correction and stereo enhancement systems. While the above detailed description has shown, described, and pointed out the fundamental novel features of the invention, it will be understood that various omissions and substitutions and changes in the form and details of the device illustrated may be made by those skilled in the art, without departing from the spirit of the invention. Therefore, the invention should be limited in its scope only by the following claims.

What is claimed is:

1. An audio enhancement apparatus operative upon left and right stereo input signals provided by a stereo reproduction device for playback through a speaker system having a fixed location within an audio reproduction environment, the enhancement apparatus modifying the stereo input signals to obtain an improved stereo image by compensating for acoustic limitations created when the input signals are reproduced by the speaker system within the audio reproduction environment, the audio enhancement apparatus comprising:

a stereo image correction circuit receiving the left and right stereo input signals and modifying said input signals using at least a first frequency correction circuit within a first frequency range and a second frequency correction circuit within a second higher frequency range on each of said input signals to generate corresponding energy-corrected left and right stereo signals, wherein the first frequency range is processed independently from the second higher frequency range, said energy-corrected left and right signals creating a corrected spatial response, said corrected spatial response creating an apparent sound image which relocates the perceived position of said speaker system to an apparent position when heard by a listener;

a stereo image enhancement circuit receiving the energy-corrected left and right stereo signals and generating enhanced left and right stereo signals to provide a spatially enhanced apparent sound image which is perceived by said listener to substantially emanate from said apparent position when said enhanced left and right stereo signals are reproduced through said speaker system; and wherein said energy-corrected left and right signals are characterized by a first ambient component, and said enhanced left and right stereo signals are characterized by a second ambient component, said second ambient component selectively equalized with respect to said first ambient component.

2. The audio enhancement apparatus of claim 1 wherein said acoustic limitations are a function of said fixed location of said speaker system with respect to said listener.

3. The audio enhancement apparatus of claim 1 wherein said acoustic limitations are inherent characteristics of said speaker system.

4. The audio enhancement apparatus of claim 1 wherein said apparent position perceived by said listener is defined by an azimuth and elevation with respect to said listener different from that of said speaker system.

5. The audio enhancement apparatus of claim 1 wherein said acoustic limitations are a function of said fixed location of said speaker system with respect to said listener and a function of sound absorption characteristics of said audio reproduction environment.

6. The audio enhancement apparatus of claim 1 wherein said corrected spatial response is characterized by sound-pressure energy levels which are substantially constant across all audible frequencies above 100 Hz with respect to said listener.

7. The audio enhancement apparatus of claim 1 wherein:
said first frequency correction circuit modifies components of said left and right input signals within a first frequency range to create a first corrected stereo signal component; and
said second frequency correction circuit modifies components of said left and right input signals within a second frequency range to create a second corrected stereo signal component, said first and second corrected stereo signal components combined to generate said energy-corrected left and right signals.

8. The audio enhancement apparatus of claim 7 wherein a combiner combines a respective one of said input signals with said first and second corrected stereo signal components to generate said energy-corrected left and right signals.

9. The audio enhancement apparatus of claim 7 wherein said first corrected stereo signal component comprises signals having frequencies between approximately 100 Hz to 1 kHz, and said second corrected stereo signal component comprises signals having frequencies between approximately 1 kHz to 10 kHz.

10. The audio enhancement apparatus of claim 7 wherein said second corrected stereo signal component is attenuated by said energy-correction circuit.

11. The audio enhancement apparatus of claim 7 wherein said second frequency correction circuit boosts said input signal components within said second frequency range to generate said second corrected stereo signal component, and wherein said audio enhancement apparatus further comprises a combiner having a switch with a first position and a second portion, wherein said second corrected stereo signal component is added to said first corrected stereo signal component by said combiner when said switch is in said first position, and said second corrected stereo signal component is subtracted from said first corrected stereo signal component when said switch is in said second position.

12. The audio enhancement apparatus of claim 1 wherein said audio enhancement apparatus is implemented in digital format by a digital signal processor.

13. The audio enhancement apparatus of claim 1 wherein said audio enhancement apparatus is implemented using discrete circuit components.

14. The audio enhancement apparatus of claim 1 wherein said left and right stereo input signals are synthetically generated from a monophonic audio signal source.

15. The audio enhancement apparatus of claim 1 wherein said left and right stereo input signals are part of an audio-visual composite signal.

16. The audio enhancement apparatus of claim 1 wherein said audio enhancement apparatus is constructed as a digital and analog hybrid circuit.

17. The audio enhancement apparatus of claim 1 wherein said audio enhancement system is contained within a semiconductor substrate.

18. The audio enhancement apparatus of claim 1 wherein said audio enhancement system is contained within a multichip module.

19. The audio enhancement apparatus of claim 1 wherein said audio reproduction environment is the interior of an automobile having first and second door panels positioned on opposite sides of a driver of said automobile and wherein said speaker system comprises a first speaker positioned within said first door panel and a second speaker positioned within said second door panel.

20. The audio enhancement apparatus of claim 1 wherein said audio reproduction environment is associated with an electronic keyboard apparatus having a keyboard and wherein said speaker system comprises first and second speakers connected to said electronic keyboard apparatus, said first and second speakers placed beneath said keyboard.

21. A stereo enhancement device for inputting a pair of stereophonic left and right audio signals and providing processed left and right audio signals to a speaker system for reproduction of a sound image corresponding to said processed signals, said stereo enhancement device comprising:

a first means for selectively altering the amplitude levels of the left and right audio signals at a first frequency range and a second means for selectively altering the amplitude levels of the left and right audio signals at a second frequency range to create corresponding corrected left and right audio signals, said corrected left and right audio signals configured to generate an apparent sound image with respect to a listener when said corrected signals are played through the speaker system, wherein the first frequency range is processed separately from the second frequency range, said apparent sound image conveying a perceived source of origin which is vertically distinct from an actual source of origin for said sound image; and means for enhancing said corrected left and right audio signals to emphasize reverberant sound energy present in said corrected left and right audio signals, said means for enhancing producing said processed left and right audio signals, said processed left and right audio signals configured to broaden said apparent sound image which is perceived by said listener to substantially emanate from said perceived source of origin.

22. The stereo enhancement device of claim 21 wherein means for enhancing said corrected signals amplifies selected frequency components of an ambience signal by predetermined amounts, said predetermined amounts determined as a function of said actual source of origin for said sound image.

23. The stereo enhancement device of claim 21 wherein playback of the left and right audio signals through said speaker system generates a first frequency-dependent sound pressure response with respect to a listener, and playback of the left and right audio signals through a speaker system located at said perceived source of origin generates a second frequency-dependent sound pressure response with respect to said listener, said corrected left and right audio signals generating said second frequency-dependent sound pressure response with respect to the listener when said corrected left and right audio signals are reproduced by said speaker system.

24. The stereo enhancement apparatus of claim 21 wherein said means for selectively altering further comprises:

means for dividing said stereophonic audio signals into low-frequency components and high-frequency components;

means for equalizing said low and high frequency components to generate low-frequency and high-frequency energy-corrected audio signals; and means for combining low and high-frequency energy-corrected audio signals to generate said corrected left and right audio signals.

25. The stereo enhancement apparatus of claim 24 wherein said low-frequency components are contained within a frequency range of approximately 100 to 1000 Hz, and said high-frequency components are contained within a frequency range of approximately 1000 to 10,000 Hz.

26. The stereo enhancement apparatus of claim 21 wherein said low-frequency components correspond to a first frequency range of said stereophonic audio signals and said high-frequency components correspond to a second frequency range of said stereophonic audio signals, said low-frequency components boosted over said first frequency range and said high-frequency components attenuated over said second frequency range.

27. A spatial enhancement apparatus for redirecting and enhancing a stereophonic image emanating from a speaker system located within an audio reproduction environment, said spatial enhancement apparatus comprising:

an acoustic-image correcting circuit receiving an audio input signal and producing with at least a first frequency range and a second higher frequency range a corrected audio signal, wherein said first range is processed separately from said second range, said audio input signal creating a first sound-pressure response with respect to a listener when played through the speaker system, and said corrected audio signal creating a second sound-pressure response when played through said speaker system, said second sound-pressure response generating an apparent stereo image which relocates the perceived apparent location of said speaker system when said apparent stereo image is heard by said listener; and an acoustic-image enhancement circuit receiving said corrected audio signal and providing an enhanced audio signal for reproduction through said speaker system, said enhanced audio signal equalized with respect to said corrected audio signal to broaden said apparent stereo image which is perceived by said listener to substantially emanate from said apparent location of said speaker system.

28. The spatial enhancement apparatus of claim 27 wherein the corrected audio signal is a stereophonic signal comprising an ambient component representing the amount of stereo information present in the corrected audio signal, the acoustic-image enhancement circuit equalizing said ambient component to emphasize reverberant sound energy in said corrected audio signal for broadening said apparent stereo image.

29. The acoustic correction apparatus of claim 27 wherein said acoustic-correcting circuit comprises:

a first filter receiving said audio input signal and providing a first filtered output signal, said first filter having a frequency-response characteristic comprising a first transition band, said audio input signal having amplitude levels modified throughout said first transition band as a function of frequency;

a second audio filter receiving said audio input signal and providing a second filtered output signal, said second audio filter having a frequency-response characteristic comprising a second transition band, said audio input signal having amplitude levels modified throughout said second transition band as a function of frequency;

an amplifier for boosting the amplitude levels of said first and second filtered output signals, and for combining said first and second filtered output signals with said audio input signal to generate said corrected audio signal, said corrected audio signal creating said apparent stereo image when reproduced through said speaker system.

30. The acoustic correction apparatus of claim 27 wherein said audio reproduction environment is the interior of an automobile, said automobile having a dashboard and said apparent stereo image emanating from the direction of said dashboard towards said listener.

31. The acoustic correction apparatus of claim 27 wherein said audio reproduction environment is an outdoor area and wherein said listener may be situated at a plurality of locations within said audio reproduction environment.

32. An audio enhancement apparatus comprising:

a first circuit which modifies a first plurality of frequencies by dividing the frequencies into a first frequency component and a second frequency component of at least a first input channel to create a corrected spatial response, wherein said first frequency component is processed separately from said second frequency component, said corrected spatial response configured to relocate the perceived location of a sound source from a first location to a second apparent location when a resulting sound image is perceived by a listener; and a second circuit which modifies a second plurality of frequencies of said first input channel to create an enhanced corrected spatial response which broadens said sound image perceived to substantially emanate from said second apparent location.

33. The audio enhancement apparatus of claim 32 wherein said first circuit modifies a third plurality of frequencies to create a second corrected spatial response, said second corrected spatial response configured to generate a sound image which relocates the perceived location of said sound source to a third location when said sound image is perceived by a listener.

34. The audio enhancement apparatus of claim 32 wherein said sound source is located within the interior of an automobile, said automobile comprising said interior and a dashboard, and wherein said second apparent location of said sound source is perceived to be near said dashboard.

35. The audio enhancement apparatus of claim 32 wherein said sound source is positioned beneath an electronic keyboard and wherein said second apparent location is perceived by said listener to be above said keyboard.

36. The audio enhancement apparatus of claim 32 wherein said sound source is located in an outdoor area and wherein said second apparent location of said sound source is perceived to be at a different location within said outdoor area.

37. The audio enhancement apparatus of claim 32 wherein said corrected spatial response is characterized by sound-pressure energy levels which are substantially constant across all audible frequencies above 100 Hz with respect to said listener.

38. The audio enhancement apparatus of claim 32 wherein said audio enhancement apparatus is implemented in digital format by a digital signal processor.

39. The audio enhancement apparatus of claim 32 wherein said audio enhancement apparatus is implemented using discrete circuit components.

40. The audio enhancement apparatus of claim 32 wherein said first input channel is a monophonic audio signal source.

41. The audio enhancement apparatus of claim 32 wherein said first input channel is part of an audio-visual composite signal.

42. The audio enhancement apparatus of claim 32 wherein said audio enhancement apparatus is constructed as a digital and analog hybrid circuit.

43. The audio enhancement apparatus of claim 32 wherein said audio enhancement system is contained within a semiconductor substrate.

44. The audio enhancement apparatus of claim 32 wherein said audio enhancement system is contained within a multi-chip module.

45. The stereo enhancement device of claim 32 wherein said second circuit amplifies selected frequency components of an ambience signal.

46. The audio enhancement apparatus of claim 32 wherein said first circuit further comprises:

a first frequency correction circuit which is configured to modify components of said first input channel within a first frequency range to create a first corrected signal component; and a second frequency correction circuit which is configured to modify components of said first input channel within a second frequency range to create a second corrected signal component.

47. The audio enhancement apparatus of claim 46 wherein a combiner combines audio information in said first input channel with said first and second corrected stereo signal components to generate said corrected spatial response.

48. The audio enhancement apparatus of claim 46 wherein said first corrected signal component comprises signals having frequencies between approximately 100 Hz to 1 kHz.

49. The audio enhancement apparatus of claim 46 wherein said second corrected signal component comprises signals having frequencies between approximately 1 kHz to 10 kHz.

50. The audio enhancement apparatus of claim 46 wherein said second frequency correction circuit attenuates audio information within said second frequency range to generate said second corrected signal component.

51. The audio enhancement apparatus of claim 46 wherein said second frequency correction circuit boosts audio information within said second frequency range to generate said second corrected signal component.

52. The audio enhancement apparatus of claim 46 wherein said first corrected signal component is boosted over said first frequency range and wherein said second corrected signal component is attenuated over said second frequency range.

53. The audio enhancement apparatus of claim 46 wherein said first circuit further comprises a combiner having a switch with a first position and a second position, wherein said second corrected signal component is added to said first corrected signal component by said combiner when said switch is in said first position, and said second corrected signal component is subtracted from said first corrected signal component when said switch is in said second position.

54. An audio enhancement apparatus comprising:

first and second speakers located at first and second positions;

a first circuit which modifies a first plurality of frequencies by dividing the frequencies into a first frequency set and a second frequency set within audio information, processing the first frequency set separately from the second frequency set to create a corrected spatial response for said audio information, said corrected spatial response configured to generate a sound image which is perceived to emanate from a virtual third speaker located at an apparent third position and a virtual fourth speaker located at an apparent fourth position when said audio information is audibly reproduced and a resulting sound image is perceived by a listener; and a second circuit which modifies a second plurality of frequencies with said audio information to create an enhanced corrected spatial response which broadens said sound image perceived to substantially emanate from said virtual third speaker and said virtual fourth speaker.

55. An audio correction apparatus comprising:

a first circuit which modifies a first plurality of frequencies by dividing the frequencies into a first frequency component and a second higher frequency component within audio information, processing the first frequency component independently of the second frequency component to create a corrected spatial response for said audio information, said first corrected spatial response configured to change the perceived location of a sound source from a first location to a second apparent location when said audio information is audibly reproduced and perceived by a listener; and a second circuit which modifies a second plurality of frequencies within said audio information to create a modified corrected spatial response, said modified corrected spatial response configured to change the perceived direction of said sound source emanating at said second apparent location when said resulting sound image is heard by a listener.

* * * * *